United States Patent
Wan et al.

(10) Patent No.: US 6,556,588 B2
(45) Date of Patent: Apr. 29, 2003

(54) FORWARD ERROR CORRECTION AT MPEG-2 TRANSPORT STREAM LAYER

(75) Inventors: Xiang Wan, Waterloo (CA); Marc H. Morin, Waterloo (CA)

(73) Assignee: Cisco Systems Canada Co., Halifax (CA)

(*) Notice: Subject to any disclaimer, the term of this patent is extended or adjusted under 35 U.S.C. 154(b) by 0 days.

(21) Appl. No.: 10/041,137

(22) Filed: Jan. 4, 2002

(65) Prior Publication Data

US 2002/0054608 A1 May 9, 2002

Related U.S. Application Data

(63) Continuation of application No. 09/219,424, filed on Dec. 23, 1998.

(51) Int. Cl.[7] .................................................. H04J 3/24
(52) U.S. Cl. ..................... 370/474; 370/522; 370/529; 714/52; 714/752
(58) Field of Search ................................ 370/473, 529; 714/52, 57, 699, 746, 752

(56) References Cited

U.S. PATENT DOCUMENTS

| | | | | |
|---|---|---|---|---|
| 5,608,738 A | * | 3/1997 | Matsushita | 714/752 |
| 6,000,053 A | * | 12/1999 | Levine et al. | 370/470 |
| 6,081,907 A | * | 6/2000 | Witty et al. | 714/6 |
| 6,145,109 A | * | 11/2000 | Schuster et al. | 714/752 |
| 6,226,769 B1 | * | 5/2001 | Schuster et al. | 714/752 |
| 6,243,846 B1 | * | 6/2001 | Schuster et al. | 714/757 |
| 6,445,717 B1 | * | 9/2002 | Gibson et al. | 370/473 |

FOREIGN PATENT DOCUMENTS

| | | |
|---|---|---|
| EP | 0880277 | 11/1998 |
| EP | 0928086 | 7/1999 |
| JP | WO98/52323 | 11/1998 |

OTHER PUBLICATIONS

Retrieved from Internet on Apr. 14, 2000 from URL: "http://www.tmo.hp.com/tmo/pia/component_test/PIAApp/Notes/English/MPEGpaper2.html" *Protecting MPEG–2 : FEC Schemes in DVB–C,S,T*, ("Protecting MPEG–2") Copyright 1944–1998 Hewlett–Packard Company XP002135979—the whole document.

Drury G M: "DVB Channel Coding Standards For Broadcasting Compressed Video Services" *Electronics and Communication Engineering Journal*, GB Institution of Electrical Engineers, London, vol. 9, No. 1, Feb. 1, 1997 pp. 11–20, XP000722904 ISSN: 0954–0695—the whole document.

ISO/IEP "*Information Technology–Generic Coding of Moving Pictures Associated Audio Information: Video*", ISO/IEC 13818–2, 1995, 209 pages.

ISO/IEP "*Information Technology–Generic Coding of Moving Pictures and Associated Audio: Audio*", ISO/IEP 13808–3, Nov. 11, 1994, 104 pages.

* cited by examiner

Primary Examiner—Hassan Kizou
Assistant Examiner—Dmitry Levitan
(74) Attorney, Agent, or Firm—Beyer, Weaver & Thomas, LLP.

(57) ABSTRACT

The invention is for a system and method for performing forward error correction on an MPEG-2 transport stream that has optional error correction information embedded within the sport stream. An error correction operation is performed on a super group of packets within the transport stream. The error correction data is inserted into a created trailer group of MPEG-2 compliant transport stream packets having no payload, but only an adaptation field The trailer group packets are optional and therefore can be discarded by a standard MPEG-2 decoder, but can also be used to recover data lost in the transmission of the transport stream. The invention results in a system and method to correct an MPEG-2 transport stream that can be used in any one of the digital video broadcast (DVB) formats, without the need for error correction decoders which are specific to the DVB format.

22 Claims, 17 Drawing Sheets (Step 300)

Figure 6 (Step 350)

(Step 400)

(Step 400 - Continued)

(Step 450)

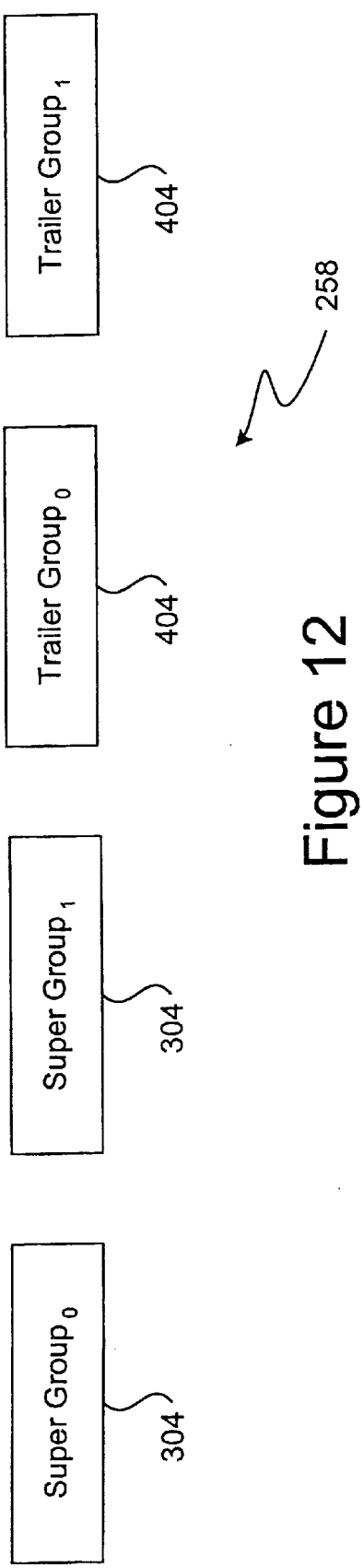
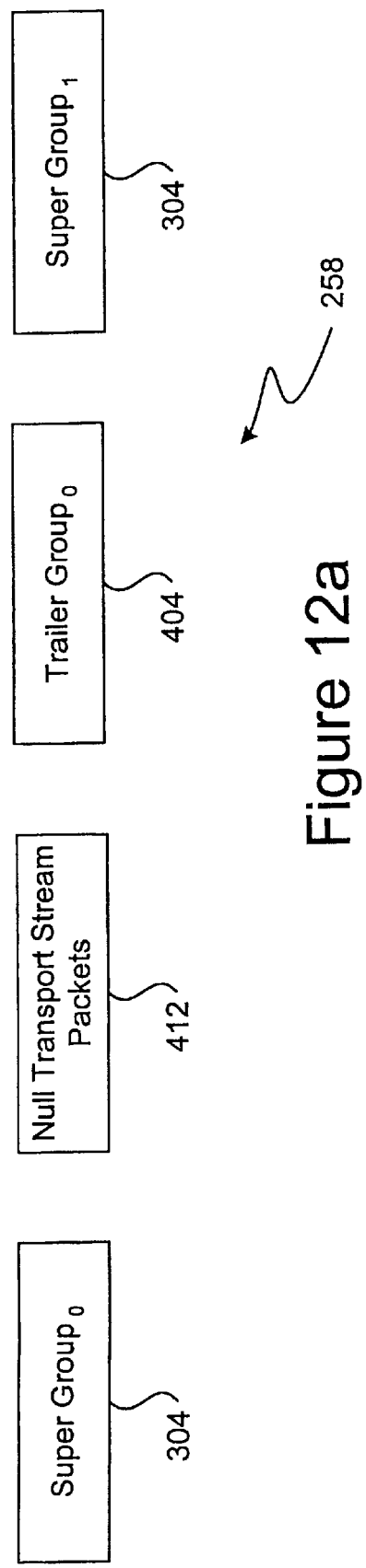

FORWARD ERROR CORRECTION AT MPEG-2 TRANSPORT STREAM LAYER

This is a continuation of application Ser. No. 09/219,424 filed Dec. 23, 1998.

FIELD OF THE INVENTION

This invention relates to techniques of forward error correction with a communications protocol, and in particular, relates to forward error correction of MPEG-2 at the transport stream layer.

BACKGROUND OF THE INVENTION

Digital video includes the steps of the encoding of moving pictures into a digital signal, broadcasting the digital signal, and decoding the digital signal into a viewable format such as a television screen or a computer monitor. With the rapid improvements in computer technology, digital video is now readily available for computer systems, etc. and will soon be widely available for broadcasting. As digital video can also incorporate the transmission of audio signals, it is believed that this technology will eventually replace current television technology (analog video), and will have broad application in many areas such as the Internet and telecommunications in general.

Because of the broad application of digital video, the International Organization For Standardization (ISO) formed ISO/IEC JTC1 SC29 WG11, more commonly known as the Motion Pictures Expert Group 2 (MPEG-2) to generate standards for broadcast quality digital video. (An earlier committee was ISO CD 11172, or MPEG-1, which created the first generation of digital video standards, which are optimised for CD-ROM. Another variant under development is MPEG-4 for low bandwidth video telephony.) In particular, MPEG-2 defines a compressed bit stream, but the actual implementation of the compression operations are up to individual manufacturers of digital video equipment.

MPEG-2 is a standard ("MPEG-2 standard") with various parts at different levels of completion. Of particular interest are:

ISO/IEC DIS 13818-1 Information technology
   Generic coding of moving pictures and associated audio information:
   Systems ISO/IEC DIS 13818-2 Information technology
   Generic coding of moving pictures and associated audio information:
   Video ISO/IEC 13818-3:1995 Information technology
   Generic coding of moving pictures and associated audio information
   Part 3: Audio and the contents of each of these references are incorporated herein by reference. The MPEG-2 standard addresses the combining of one or more elementary streams of video, audio and other data into single or multiple streams which are suitable for storage or transmission. In very general terms, the MPEG-2 standard for transmitting digital video and associated audio and other information involves the following steps: first, a digital video signal (from a digital camera or from an analog to digital converter) is compressed by analyzing and encoding the signal using spatial and temporal redundancy. Spatial redundancy refers to the redundant information inside one video frame while temporal redundancy refers to the redundant information between consecutive frames. This process generates: Intra-frames (I-frames), which contain all of the information in an entire image; Predicted frames (P-Frames), which have some compression as they are predicted based on past I-frames and/or other P-frames; and Bi-directional predicted frames (B-frames), which are the most compressed images as they are predicted from past and future I-Frames and P-Frames, Next, an audio signal is compressed by removing low power tones adjacent high power tones. Removal of these tones does not affect the signal, because the high power tones tend to mask the lower power tones, making them inaudible to the human ear. Finally, the compressed video signals, audio signals and related time stamps of those signals are assembled into packets and inserted into a Packetized Elementary Stream (PES). Each packet in a packetized elementary stream contains overhead information such as a start code, stream id, packet length, optional packetized elementary stream header and stuffing bytes, in addition to the actual packet bytes of video and audio data.

It will be apparent from the foregoing that the packetized elementary stream contains encoded video and audio data for storage or transmission. In order to multiplex several streams of packetized elementary streams, a Programme Specific Information (PSI) table is also created, which includes a series of tables to reassemble specific packetized elementary stream within multiple channels of packetized elementary streams. Thus, the packetized elementary stream and program specific information form the basis for constructing either a Program Stream (PS) or a Transport Stream (TS) of packetized elementary stream and program specific information packets, which are particularly defined in ISO/IEC International Standard 13818-1.

The Program Stream is generally suitable for communicating or storing one program of coded data and other data in error free environments, such as an optical storage device, and where processing of system coding is a major consideration. In contrast, the Transport Stream is suitable for storing or communicating one or more programs in environments where significant errors can occur, such as packet-switched networks, etc. These errors can be manifested as bit value errors within a packet, or the loss of one or more entire packets.

However, while the transport stream was intended to protect data within the transport stream from corruption in error-prone environments, the transport stream has been found to be less than satisfactory in this regard and it remains difficult to ensure reliable transmission of the transport stream through these environments. These difficulties are more particularly explained in "Protecting MPEG-2: FEC schemes in DVB-C,S,T", ("Protecting MPEG-2") © Copyright 1994–1998 Hewlett-Packard Company, the contents of which are incorporated herein by reference, and a copy of which is available at:

http://www.tmo.hp.com/tmo/pia/component_test/PIAApp/Notes/English/MPEGpaper2.html.

An example of error prone environments in which the transport stream can be broadcast are the various Digital Video Broadcasting Project (DVB) formats, such as Direct Broadcast Satellite (DBS), terrestrial cable networks (including coax and fibre optic etc.) or terrestrial broadcasts. In order to protect the transport stream and to achieve a Bit Error Ratio (BER) of no more than $10^{-11}$, Forward Error Correction (FEC) is now often added to protect the transport stream during transmission. In simple terms, the method of correcting in these formats is as follows: the original transport stream is inserted into a forward error correction encoder; the resulting signal is broadcast over the environment to a receiver; and the transport stream is recovered from the received signal by a symmetric forward error correction decoder.

Generally, a different forward error correction encoder and decoder is required for each DVB format, and this requires that each receiver have a symmetric forward error correction decoder. Variations between forward error correction encoding techniques, such as Reed-Solomon (RS) include the actual amount of error correction code added to the end each transport stream packet, whether the forward error correction packets are interleaved or spliced, and whether viterbi convolutional coding is performed. In addition to the necessity of a symmetric forward error correction decoder, it will be apparent that the addition of error correction code to the end of each packet effectively adds another layer to the protocol stack and this new layer is specific to the transmission architecture and not subject to the MPEG-2 standard. Thus, a broadcaster must ensure that each intended receiver has a symmetric forward error correction decoder.

SUMMARY OF THE INVENTION

It is an object of the present invention to provide a novel forward error correction method and system to protect a digital transport stream which obviates or mitigates at least one of the disadvantages of the prior art.

In a first aspect of the present invention, there is provided a method of creating a portion of an enhanced MPEG compatible data stream with optional forward error correction information included therein, the method comprising the steps of:

receiving an MPEG data stream of data packets from an MPEG data stream source;

forming a super group including a predefined number of the data packets;

performing a selected forward error correcting operation on the super group of packets to obtain error correction data;

creating index data which relates the error correction data to one or more corresponding super group data packets;

creating a trailer group including a sufficient number of MPEG compliant packets to accommodate the error correction data and the index data, the trailer group further including code to identify each packet as optional;

arranging the error correction data and the index data into the trailer group; and, assembling the MPEG compatible data stream with at least one super group followed by at least one trailer group corresponding with the at least one super group.

In particular, the assembly according to the method of the first aspect comprises two super groups followed by two corresponding trailer groups.

Alternately, the assembly according to the method of the first aspect comprises the super group followed by a predefined number of null packets and is then followed the trailer group. Typically, the predefined number is equivalent to an estimated maximum burst error of the broadcast environment.

Typically, the data stream according to the first aspect is an MPEG-2 transport stream; the super group comprises two-hundred-and-forty-six data packets; the trailer group comprises eleven data packets; and the forward error correction operation is Reed Solomon coding. It is generally preferred that the error correction operation be performed on parallel bytes of each packet within the super group. As found in the MPEG-2 standard, it is preferable that each of the packets in the super group includes a packet identifier and each of the packets in the trailer group includes a packet identifier different from the super group packet identifiers.

In a second aspect of the invention, there is provided a method of creating a portion of an enhanced MPEG compatible data stream with optional forward error correction information included therein, comprising the steps of:

receiving an MPEG data stream of data packets from an MPEG data stream source;

creating at least one MPEG compatible packet with no data included therein;

creating an unused portion of each packet received by shifting a portion of payload data in each of the received packets into the at least one created MPEG compatible packet, the created at least one MPEG compatible packets also having an unused portion;

performing a predefined forward error correcting operation on the payload data of each packet from the previous step to obtain forward error correction data; and arranging the error correction data in the unused portions so as to interleave the error correction data with the payload data.

Typically, the data stream in the second aspect is an MPEG-2 transport stream. It is also generally preferred that the forward error correction operation is Reed Solomon coding.

In a third aspect of the present invention, there is provided a method of creating a portion of an enhanced MPEG compatible data stream with optional forward error correction information included therein, comprising the steps of:

receiving an MPEG data stream of data packets from an MPEG data stream source;

forming a super group comprising a predefined number of packets;

forming a plurality of sub-groups comprising a predefined number of packets from the super group;

creating at least one MPEG compatible packet with no data included therein;

creating an unused portion in a first packet of each sub-group by shifting a portion of payload data in each of the first packets into the at least one created MPEG compatible packet created in the previous step, the created packets being reinserted into the MPEG data stream being received in the first step;

embedding an identifier within the unused portion of the first packet of each sub-group;

performing a selected forward error correcting operation on the super group of packets to obtain error correction data;

creating index data which relates the error correction data to one or more corresponding sub-group data packets in relation to the embedded identifiers;

creating a trailer group including a sufficient number of MPEG compliant packets to accommodate the error correction data and the index data, the trailer group further including code to identify each packet as optional;

arranging the error correction data and the index data into the trailer group; and, assembling the MPEG compatible data stream with at least one super group followed by at least one trailer group corresponding with the at least one super group.

Typically, the data stream in the third aspect is an MPEG-2 transport stream. Further, it is generally preferred that the super group comprises two-hundred-and-forty-six data packets, each sub-group comprises six data packets, the trailer group comprises ten data packets, and the forward error correction operation is Reed Solomon coding performed on parallel bytes of each packet within the super group.

It is also typical in the method of the third aspect that each of the packets in the super group include a packet identifier and each of the packets in the trailer group include a packet identifier different from the super group packet identifiers.

In a fourth aspect of the present invention, there is provided a method of creating a portion of an enhanced MPEG compatible data stream with optional forward error correction information included therein, comprising the steps of:

receiving an MPEG data stream of data packets from an MPEG data stream source;

forming a super group comprising a predefined number of packets;

creating at least one MPEG compatible packet with no data included therein;

creating an unused portion in each super group packet by shifting a portion of payload data in each of the super group packets into the at least one created MPEG compatible packet, the created packets being reinserted into the MPEG data stream being received in the first step;

embedding an identifier within the unused portion of each of the super group packets;

performing a selected forward error correcting operation on the super group of packets to obtain error correction data;

creating index data which relates the error correction data to one or more corresponding super group data packets in relation to the embedded identifiers;

creating a trailer group including a sufficient number of MPEG compliant packets to accommodate the error correction data and the index data, the trailer group further including code to identify each packet as optional;

arranging the error correction data and the index data into the trailer group; and, assembling the MPEG compatible data stream with at least one super group followed by at least one trailer group corresponding with the at least one super group.

In particular, the assembly according to the method of the fourth aspect comprises two super groups followed by two corresponding trailer groups.

Alternately, the assembly according to the method of the first aspect comprises the super group followed by a predefined number of null packets and is then followed the trailer group. Typically, the predefined number is equivalent to an estimated maximum burst error of the broadcast environment.

Typically, the data stream in the fourth aspect is an MPEG-2 transport stream, the super group comprises two-hundred-and-forty-six data packets, the trailer group comprises eleven data packets, the forward error correction operation is Reed Solomon coding and the error correction operation is performed on parallel bytes of each packet within the super group.

It is also typical in the method of the fourth aspect that each of the packets in the super group include a packet identifier and each of the packets in the trailer group include a packet identifier different from the super group packet identifiers.

In a fifth aspect of the present invention, there is provided a method of transmitting data as an enhanced MPEG compatible data stream with optional forward error correction information included therein, the method comprising the steps of:

receiving an MPEG data stream of data packets from an MPEG data stream source;

forming a super group including a predefined number of the data packets;

performing a selected forward error correcting operation on the super group of packets to obtain error correction data;

creating index data which relates the error correction data to one or more corresponding super group data packets;

creating a trailer group including a sufficient number of MPEG compliant packets to accommodate the error correction data and the index data, the trailer group further including code to identify each packet as optional;

arranging the error correction data and the index data into the trailer group;

assembling the enhanced MPEG compatible data stream with at least one super group followed by at least one trailer group corresponding with the at least one super group;

broadcasting the enhanced MPEG compatible data stream;

receiving the enhanced MPEG compatible data stream;

extracting at least one received super group and at least one received trailer group corresponding to the at least one received super group from the data stream received in the previous step; and performing an error recovery operation on the at least one received super group using the error correction data in the at least one corresponding received trailer group.

Typically, the data stream of the fifth aspect is an MPEG-2 transport stream, the forward error correction operation is Reed Solomon coding, and the error correction operation is performed on parallel bytes of each packet within the super group.

It is also typical in the method of the fifth aspect that each of the packets in the super group include a packet identifier and each of the packets in the trailer group include a packet identifier different from the super group packet identifiers.

In a sixth aspect of the invention, there is provided a method of recovering a portion of an enhanced MPEG compatible data stream of data packets having super groups of data packets and corresponding trailer groups of optional packets having forward error correction information and indexing information included therein, comprising the steps of:

receiving the enhanced MPEG compatible data stream;

extracting at least one received super group and at least one received trailer group corresponding to the at least one received super group from the received data stream;

performing an error recovery operation on the at least one received super group using the error correction data in the at least one corresponding received trailer group;

Typically, the data stream of the sixth aspect is an MPEG-2 transport stream, the super group comprises two-hundred-and-forty-six data packets, the trailer group comprises eleven data packets, and the error recovery operation is Reed Solomon decoding.

It is also typical in the method of the sixth aspect that each of the packets in the super group include a packet identifier and each of the packets in the trailer group include a packet identifier different from the super group packet identifiers.

In a seventh aspect of the invention, there is provided a system for creating a portion of an enhanced MPEG compatible data stream with optional forward error correction information included therein, comprising:

a receiver for receiving an MPEG data stream of data packets from an MPEG data stream source;

processing means for forming a super group including a predefined number of the data packets;

processing means for performing a selected forward error correcting operation on the super group of packets to obtain error correction data;

processing means for creating index data which relates the error correction data to one or more corresponding super group data packets;

processing means for creating a trailer group including a sufficient number of MPEG compliant packets to accommodate the error correction data and the index data, the trailer group further including code to identify each packet as optional;

processing means for arranging the error correction data and the index data into the trailer group;

processing means for assembling the enhanced MPEG compatible data stream with at least one super group followed by at least one trailer group corresponding with the at least one super group; and a transmitter for transmitting the enhanced MPEG compatible data stream.

In a particular system according to the seventh aspect, the MPEG source is integral with the receiver.

In an eighth aspect of the present invention, there is provided a system for recovering a portion of an enhanced MPEG compatible data stream of data packets having super groups of data packets and associated trailer groups of optional packets having forward error correction information and indexing information included therein, comprising:

a receiver for receiving the enhanced MPEG compatible data stream;

a processing means for extracting at least one received super group and at least one received trailer group corresponding to the at least one received super group from the received data stream;

a processing means for performing an error recovery operation on the at least one received super group using the error correction data in the at least one corresponding received trailer group; and, a transmitter for transmitting said recovered super group to an MPEG end-user.

In a particular system according to the seventh aspect, the MPEG end-user is integral with the transmitter.

In a ninth aspect of the invention, there is provided a portion of an enhanced MPEG compatible data stream with optional forward error correction information included therein, comprising:

at least one super group including a predefined number of data packets;

at least one trailer group including a predefined number of MPEG compliant packets, the at least one trailer group further including code to identify each packet as optional;

error correction data embedded within the at least one trailer group, the error correction data being obtained from a selected forward error correcting operation performed on at least one corresponding super group of data packets; and index data embedded within the at least one trailer group which relates said error correction data to one or more said corresponding super group data packets.

In particular, the data stream according to the ninth aspect is typically an MPEG-2 transport stream. Further, the super group in the ninth aspect typically comprises two-hundred-and-forty-six data packets, the trailer group comprises eleven data packets, the forward error correction operation is Reed Solomon coding, and the error correction data was generated from parallel bytes of each packet within said super group.

It is also typical in the method of the ninth aspect that each of the packets in the super group include a packet identifier and each of the packets in the trailer group include a packet identifier different from the super group packet identifiers.

The present invention provides a novel method and system for taking an MPEG data stream generated by an MPEG encoder and creating an enhanced MPEG compliant data stream having optional error correction data included therein, such that an asymmetric decoder or end-user can process the data contained within the original MPEG data stream and will ignore the error correction data and associated index data contained in the enhanced transport stream. However, a symmetric decoder can use the error correction to correct for errors in the received enhanced transport stream.

BRIEF DESCRIPTION OF THE DRAWINGS

The present invention will now be described, by way of example only, with reference to certain embodiments shown in the attached Figures in which:

FIG. 12a shows a first alternative of transmitting an enhanced transport stream comprising a first super group, a second super group, a first trailer group and a second trailer group;

FIG. 12b shows a second alternative of transmitting an enhanced transport stream comprising a super group, null packets and a trailer group; and, FIG. 13 shows a flowchart of a method of error recovery from an enhanced transport stream symmetric to the method of FIG. 4.

DETAILED DESCRIPTION OF THE DRAWINGS

Figure 1:
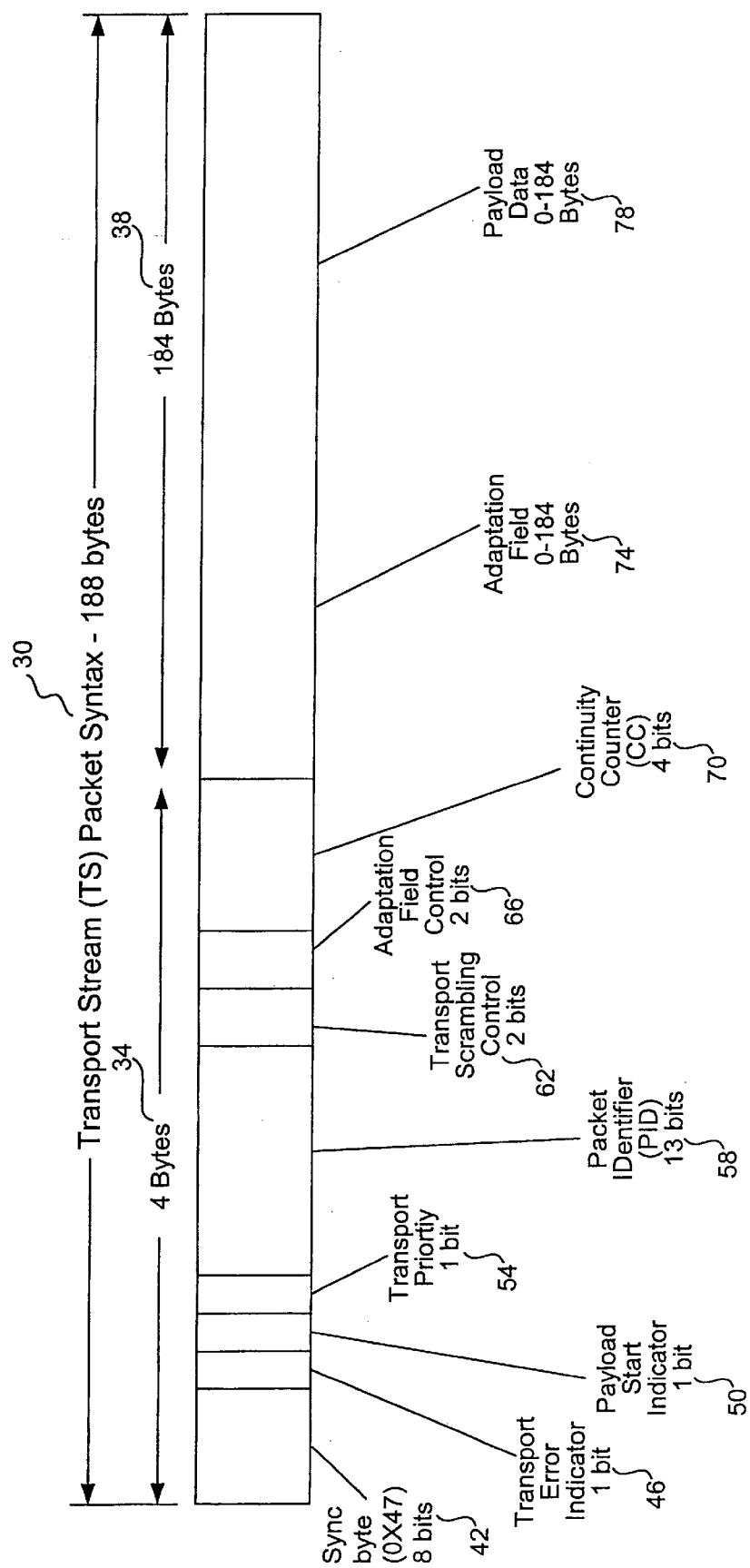
FIG. 1 shows a schematic representation of the syntax of an MPEG-2 Transport Stream (TS) Packet.

Before discussing the present invention, an MPEG-2 Transport Stream (TS) packet will be discussed briefly. An MPEG-2 transport stream packet (TSP) in accordance with ISO Standard 13818-1 is indicated generally at 30 in FIG. 1. Transport stream packet 30 is fixed in length at one-hundred-and-eighty-eight bytes and comprises a header section 34 and an information section 38. Header section 34 is fixed at four bytes in length and comprises a sync byte 42, a transport error indicator bit 46, a payload start indicator bit 50, a transport priority bit 54, a thirteen-bit Packet Identifier (PID) 58, two scrambling control bits 62, two adaptation field control bits 66, and four continuity counter (CC) bits 70.

Packet Identifier 58 indicates the type of data stored in the packet payload, such as packetized elementary stream or program specific information. Adaptation field control bits 66 indicate what type of information section 38 follows header 34. Continuity Counter 70 is incremented for each transport stream packet 30 with the same Packet Identifier 58 and wraps around to zero after reaching its maximum value. According to ISO Standard 13818-1, Continuity Counter 70 does not increment when the adaptation field control 66 equals "b00" or "b10" (As used herein, "b . . . " denotes a number expressed in binary notation). The remaining fields in header section 34 are explained in detail in ISO Standard 13818-1.

Information section 38 is fixed at one-hundred-and-eighty-four bytes in length, and comprises an adaptation field 74 and/or payload data 78. For greater clarity, information section 38 contains either: 1) an adaptation field 74 having a length of one-hundred-and-eighty-four bytes; 2) payload data 78 having a length of one-hundred-and-eighty-four bytes; or 3) an adaptation field 74 followed by payload data 78, each having variable lengths, and having a combined length of one-hundred-and-eighty-four bytes.

Figure 1A:
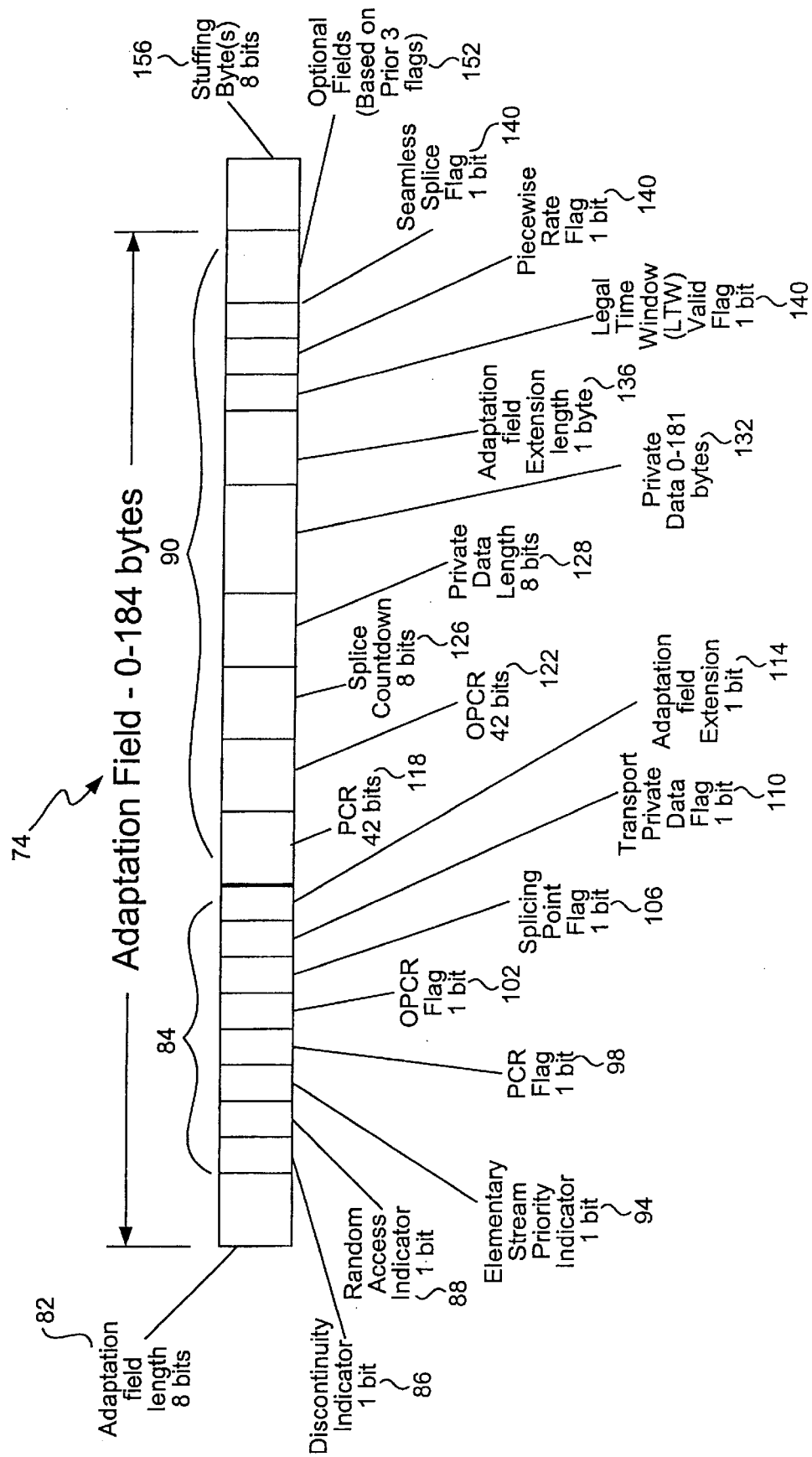
FIG. 1a shows a schematic representation of the syntax of an adaptation field in accordance with the Transport Stream Packet of FIG. 1.

Referring now to FIG. 1a, adaptation field 74 comprises an adaptation field length 82, flags 84, and data fields 90. Adaptation field length 82 specifies the number of bytes in adaptation field 74 immediately following adaptation field length 82. Flags 84 comprise eight, one-bit flags including a discontinuity indicator flag 86, a random access indicator flag 88, an elementary stream priority indicator flag 94, a Program Clock Reference (PCR) flag 98, an Original Program Clock Reference Base (OPCR) flag 102, a Splicing Point flag 106, a Transport Private Data flag 110, and an Adaptation Field Extension flag 114. Data fields 90 have a maximum length of one-hundred-and-eighty-two bytes and contain several fields corresponding to their respective flags 84, which are defined only if their respective flag 84 is set to a value of one. Data fields 90 comprise a PCR field (forty-two bits) 118, an OPCR field (forty-two bits) 122, a Splice Countdown field (eight bits) 126, a one-byte Private Data Length field 128, a Private Data Field (Variable between zero to one-hundred-and-eighty-one bytes in length) 132, a one-byte adaptation extension length field 136, three one-bit flags 140, optional fields 152 corresponding with flags 140 and one or more stuffing bytes 156. Each of the fields in adaptation field 74 are explained in detail in ISO Standard 13818-1.

Figure 1B:
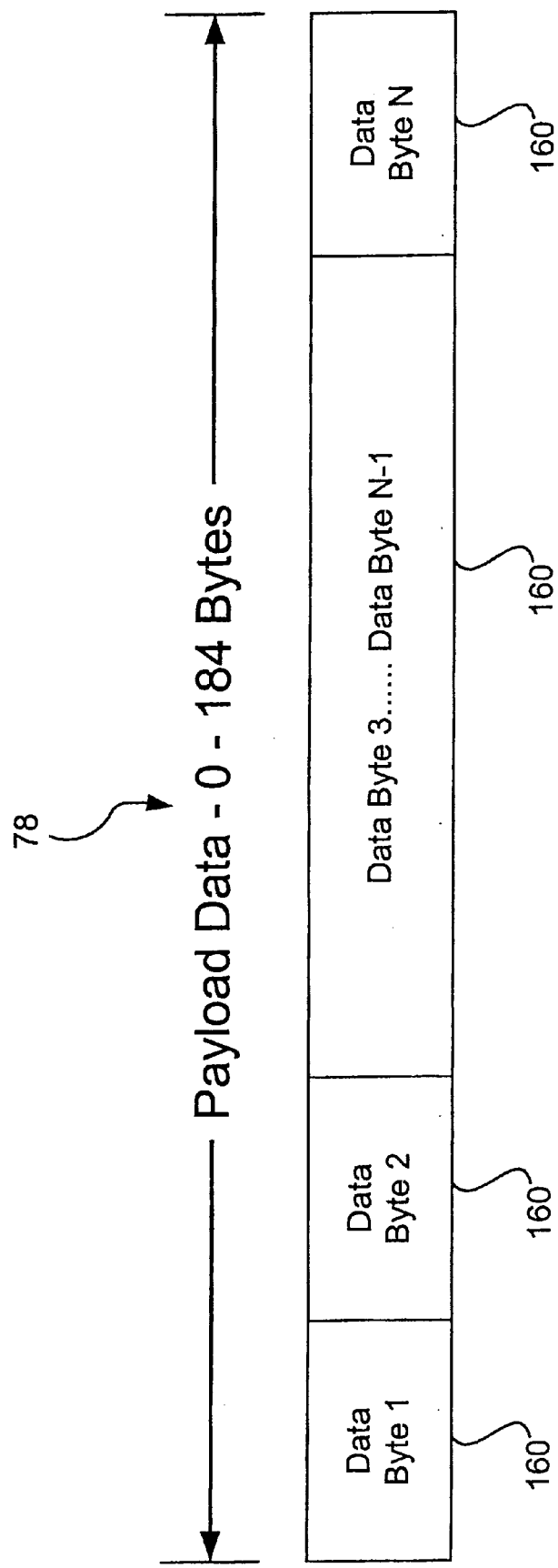
FIG. 1b shows a schematic representation of payload data in accordance with the Transport Stream Packet of FIG. 1.

Referring now to FIG. 1b, payload 78 comprises one or more data bytes 160, up to a maximum length of one-hundred-and-eighty-four bytes depending on the length of adaptation field 74. Data bytes 160 represent a series of contiguous data bytes of: 1) Packetized Elementary Stream (PES) packets, 2) Program Specific Information (PSI) Sections; 3) Packet Stuffing Bytes following PSI Sections; or 4) Private Data not in these structures as indicated by Packet Identifier 58.

Figure 2:
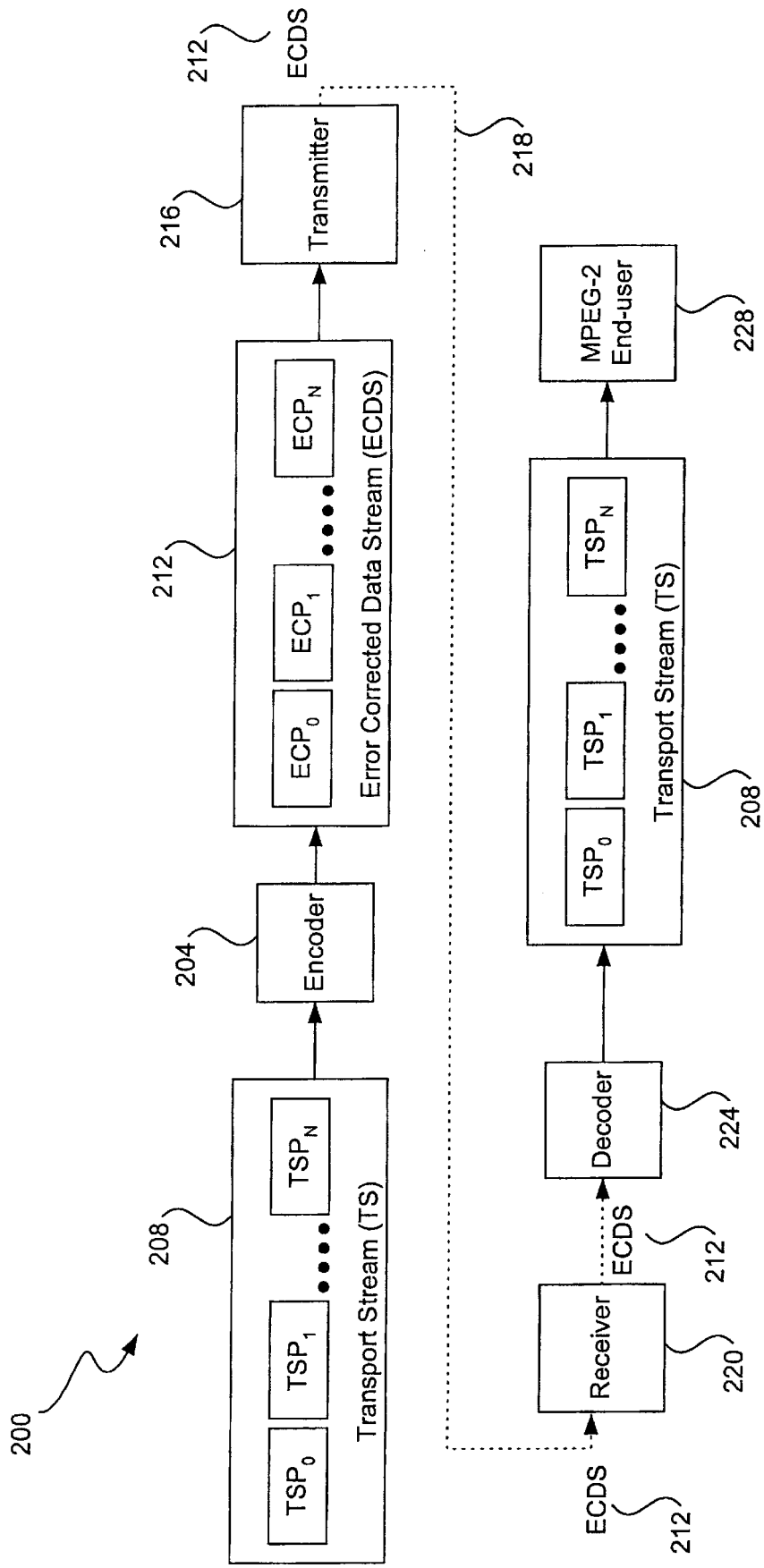
FIG. 2 shows a schematic representation of a prior art system for forward error correcting an MPEG-2 Transport Stream (TS)

Having described transport stream packet 30, a prior art forward error correction system will now be discussed, and is indicated generally at 200 in FIG. 2. Forward error correction system 200 comprises a forward error correction encoder 204 for receiving an MPEG-2 transport stream 208 from a source such as an MPEG-2 encoder, and for outputting an error corrected data stream (ECDS) 212 to a transmitter 216 such as a radio tower, satellite dish, cable head-end or any DVB transmitter as is known in the art. Transmitter 216 is connected via a broadcast environment 218 to a complementary receiver 220, which in turn is connected to a decoder 224. Decoder 224 is symmetric to encoder 204, and outputs transport stream 208 to MPEG-2 end-user 228. MPEG-2 end-user 228 can be a personal computer, a digital television, a storage device or any higher layer medium that can decode or otherwise use transport stream 208.

The operation of prior art system 200 will now be discussed with reference to FIG. 2. An MPEG-2 transport stream source, such as an MPEG-2 encoder, creates transport stream 208, which is received by forward error correction encoder 204. Forward error correction encoder 204 interleaves each transport stream packet and performs a forward error correcting operation on each transport stream packet. Any error encoding operation known in the art can be used, but the Reed-Solomon operation is generally the most common. Next, the error correcting code is added to the end of each transport stream packet, thus creating a series of error corrected packets ($ECP_0 \ldots ECP_N$). Together, these packets essentially form a new protocol layer indicated as an error corrected data stream (ECDS) 212.

Error corrected data stream 212 is then inputted into transmitter 216, which broadcasts error corrected data stream 212 via the broadcast environment to receiver 220.

During broadcast, error corrected data stream 212 can lose information due to errors caused by unreliability of environment 218. Error corrected data stream 212 is then inputted into decoder 224 which extracts transport stream 208 from error corrected data stream 212, and uses the error correcting code appended to the end of each transport stream packet, to correct for errors in $ECP_0$ through $ECP_N$. The extracted transport stream 208 is then reordered from its interleaved state and back into its correct order, and outputted to MPEG-2 end-user 228.

It will now be apparent that transport stream packet 30 does not contemplate error correction coding, and thus prior art systems of protecting transport stream effectively add another protocol layer, thereby requiring a decoder 224 symmetric to each encoder 204 and specific to the broadcast medium used. As a result, systems without decoder 224 cannot use or otherwise decode error corrected data stream 212 at all.

An embodiment of the present invention will now be discussed with reference to FIGS. 3 to 13. A system of forward error correcting an MPEG-2 Transport Stream (TS) in accordance with a presently preferred embodiment of the present invention is indicated generally at 250 in FIG. 3. Forward error correction system 250 comprises an enhanced forward error correction encoder 254 for receiving an MPEG-2 Transport Stream 208 from any suitable source such as an MPEG-2 encoder, and for outputting an enhanced transport stream (TS$^+$) 258 to a transmitter 216 such as a radio tower, satellite dish, cable head-end or any DVB transmitter as is known in the art. Transmitter 216 is connected via a broadcast environment 218 to a complementary receiver 220, which in turn can be connected to a decoder 262. Decoder 262 is symmetric to encoder 204, and outputs transport stream 208, to MPEG-2 end-user 228. However, because enhanced transport stream 258 is MPEG-2 compliant, receiver 220 can output enhanced transport stream 258 directly to MPEG-2 end-user 228, bypassing decoder 262.

Figure 3:
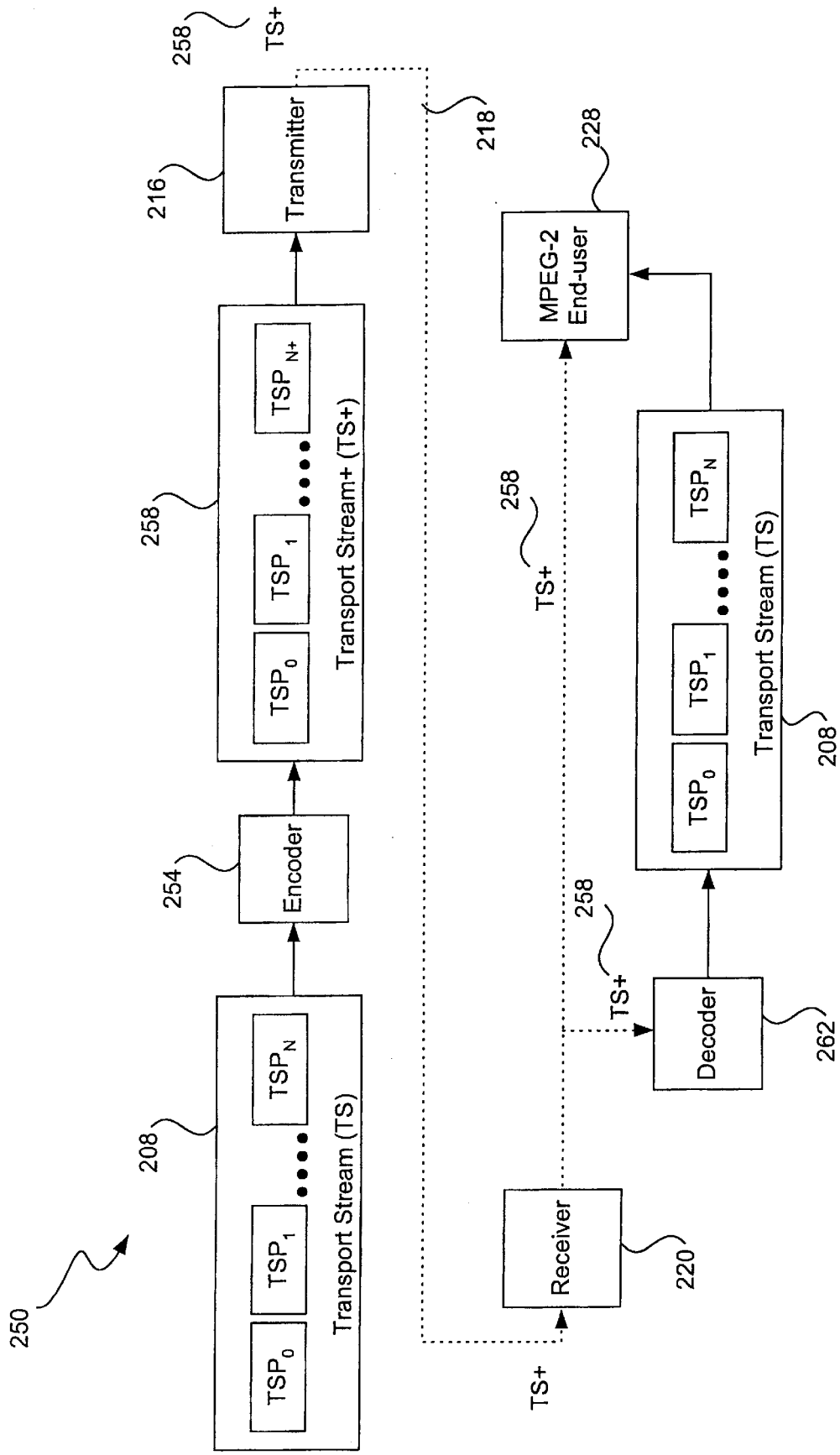
FIG. 3 shows a schematic representation of a system for forward error correcting an MPEG-2 Transport Stream (TS) in accordance with an embodiment of the present invention.

The operation of system 250 will now be discussed with reference to FIG. 3. Transport stream 208 is received by forward error correction encoder 254. As will be discussed in greater detail below, encoder 254 performs a forward error correcting operation on parallel portions of a predefined super group of packets. Next, a predefined trailer group comprising a number of optional MPEG-2 compliant transport stream packets are created, and the error correcting code is embedded within the private data fields 132 of the new packets. The end trailer group packets contain identifiers or addressing information to correlate the error correcting code with the appropriate packet in the super group. As will be explained in greater detail below, it is presently preferred that two sequential super groups should be followed by their two corresponding trailer groups in the formation of a portion of enhanced transport stream 258, in order protect for bursty errors. In another alternative, each trailer group packet can instead be simply appended to the end of its corresponding super group, to form a portion of enhanced transport stream 258. In this latter alternative, it is contemplated that a series of optional null transport stream packets containing stuffing bytes can be added between the super group and its trailer group in order to increase protection for bursty errors. The process for either alternative is repeated to form a continuous enhanced transport stream 258, which is then outputted to transmitter 216.

Enhanced transport stream 258 is then broadcasted by transmitter 216 via a broadcast environment 218 to receiver 220. During broadcast, the unreliability of the environment can cause portions of transport stream packets or entire transport stream packets within enhanced transport stream 258 to be lost. However, because enhanced transport stream 258 is MPEG-2 compliant, it can be passed directly to MPEG-2 end-user 228, which will ignore the optional trailer group and process the remaining transport stream packets according to MPEG specifications. However, enhanced transport stream 258 can also be inputted into decoder 262, if present, which recovers transport stream 208 from enhanced transport stream 258. As will be discussed in greater detail below, decoder 262 uses the error correcting code embedded within each trailer group transport stream packet, to correct for errors in $TSP_0$ through $TSP_N$. The recovered transport stream 208 is then outputted to MPEG-2 end-user 228.

Figure 4:
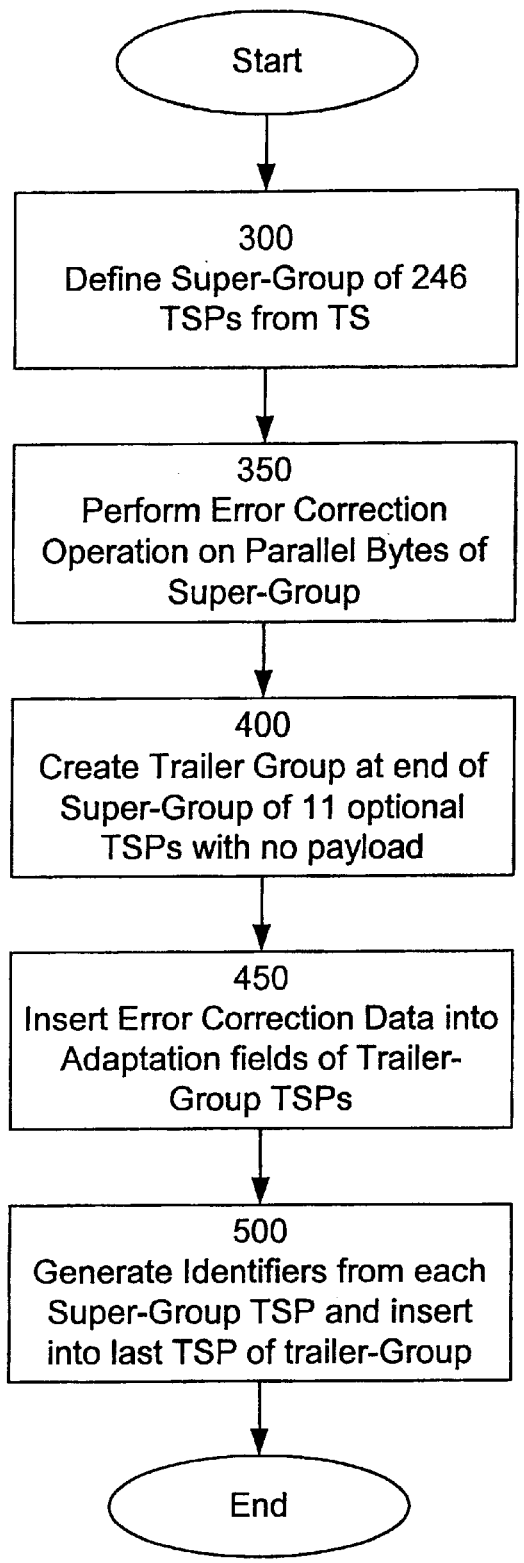
FIG. 4 shows a flowchart of a method of forward error correcting an MPEG-2 Transport Stream (TS) in accordance an embodiment of FIG. 3.
Figure 5:
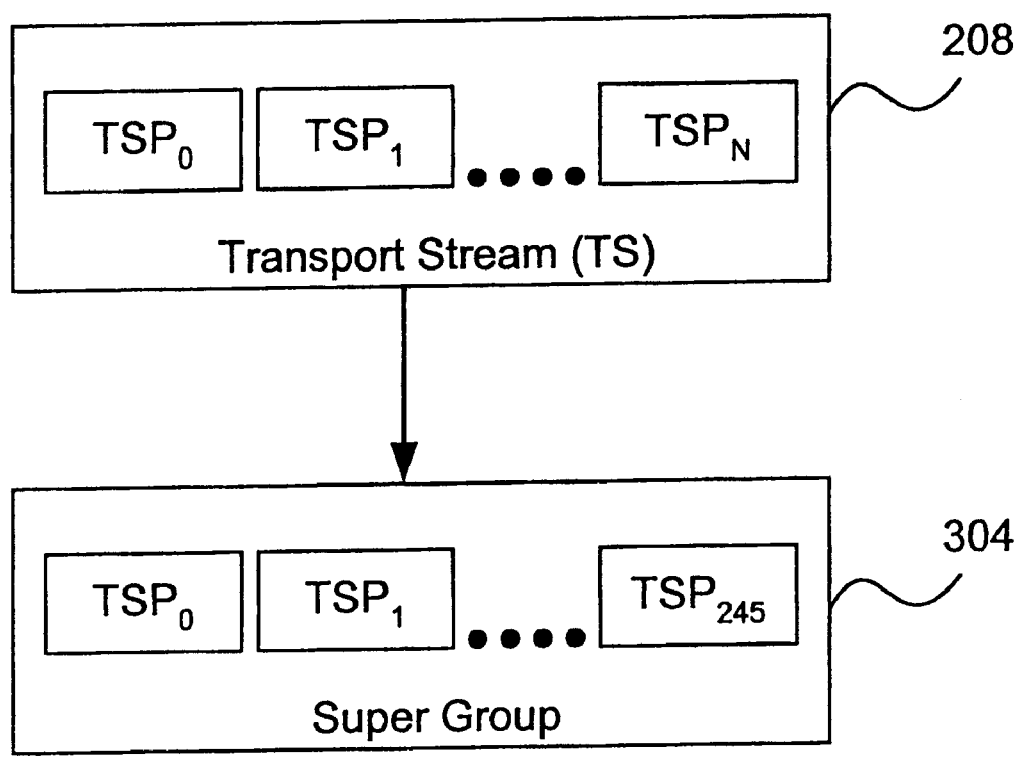
FIG. 5 shows a schematic representation of defining a super group of transport stream packets in accordance with the method of FIG. 3.

Having described system 250, the presently preferred method of forward error correction as used by encoder 254 will now be described with reference to FIGS. 4–12. Referring now to FIG. 4, at step 300 a super group of two-hundred-and-forty-six transport stream packets 30 is defined. In FIG. 5, step 300 is shown in greater detail, as two-hundred-and-forty-six transport stream packets ($TSP_0$ . . . $TSP_{245}$) are taken from transport stream 208 and formed into a super group 304. While it has been found that two-hundred-and-forty-six is a presently preferred number of transport stream packets to form super group 304, it is to be understood that other numbers of transport stream packets can be used to form super group 304 without departing from the scope of the invention. Considerations for the selection of different size super groups will be discussed in greater detail below.

Figure 6:
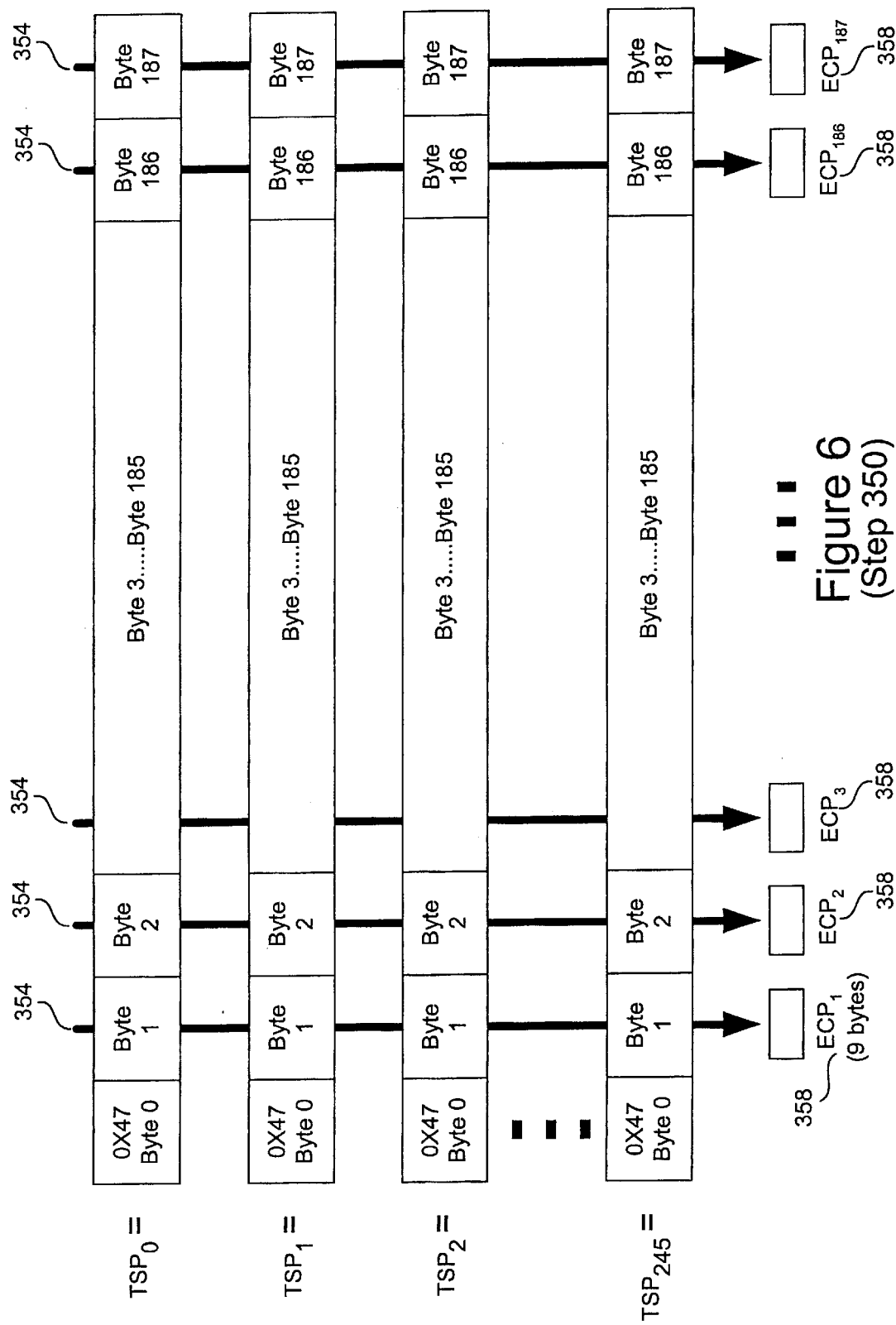
FIG. 6 shows a schematic representation of performing an error correction operation on parallel bytes within each packet of the super group in accordance with the method of FIG. 4.

Referring to FIG. 4, at step 350 a suitable error correction operation is performed on parallel bytes of each transport stream packet within super group 304. Referring to FIG. 6, step 350 is shown in greater detail. Error correction operation 354 is performed on parallel bytes of each transport stream packet ($TSP_0$, $TSP_1$, $TSP_2$, . . . $TSP_{245}$) within super group 304, thus generating error correction packets (ECP) ($ECP_1$, $ECP_2$, . . . $ECP_{187}$) as indicated at 358. For greater clarity, $ECP_1$ is derived from $Byte_1$ of $TSP_0$, $TSP_1$, $TSP_2$, through $TSP_{245}$; $ECP_2$ is derived from $Byte_2$ of $TSP_0$, $TSP_1$, $TSP_2$, through $TSP_{245}$ etc. The foregoing is presently preferred in order to protect for bursty errors and can thus obviate the need to interleave the transport stream packets within the transport stream. However, it will be understood that error correction operation 354 can be performed on other parallel or non-parallel structures of super group 304, although it is preferred that at least one byte for processing is taken from each TS packet and no byte is processed twice to achieve at least some interleaving of the data.

Any error correction operation known in the art can be used, but in a presently preferred embodiment, Reed Solomon coding is used to generate error correction packets 358 of nine bytes each. In order to reduce the size of error correction data, it is presently preferred to only perform error correction operation 354 on $Byte_1$-$Byte_{187}$, as $Byte_0$ or Sync Byte 42 within each transport stream packet is always known to be "0x47". (As used herein, "0x . . . " indicates a number expressed in hexadecimal format.)

Figure 7:
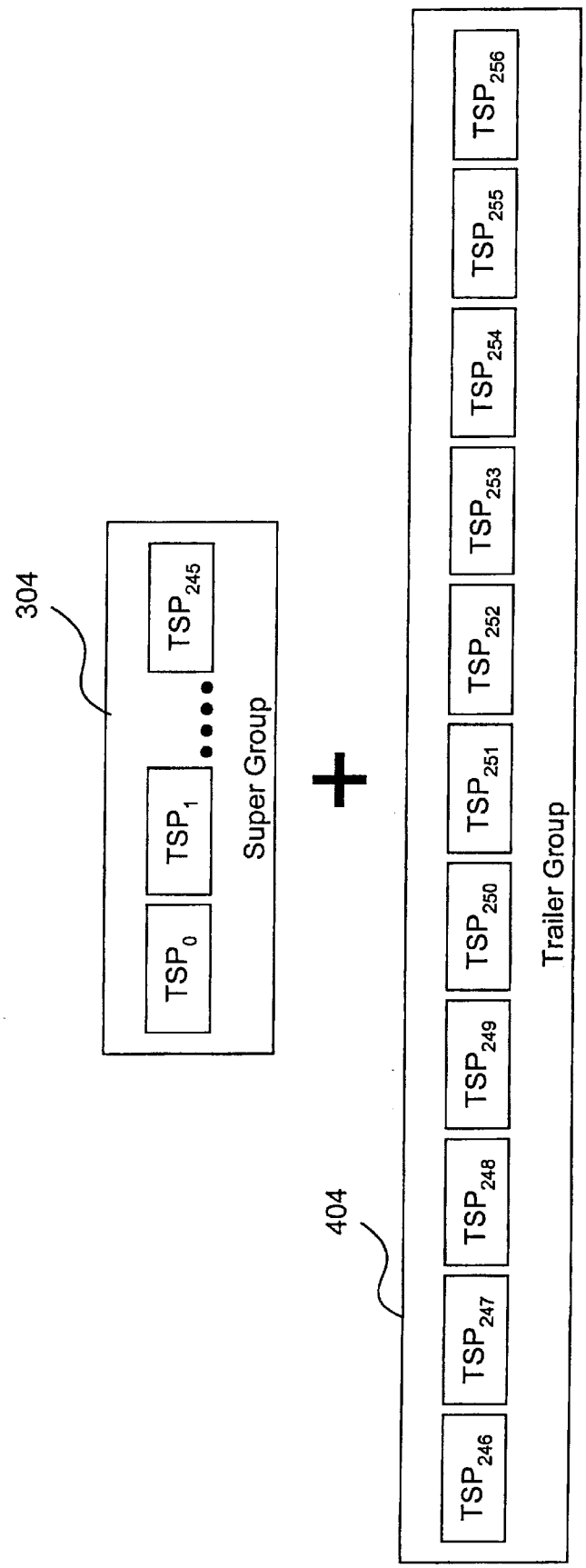
FIG. 7 shows a schematic representation of creating a trailer group at the end of the super group shown in FIG. 5 and in accordance with the method of FIG. 4.

Referring to FIGS. 4 and 7, at step 400 a trailer group 404 consisting of eleven MPEG-2 compliant transport stream packets is created and added to super group 304. It is to be understood that eleven transport stream packets is particularly suited accommodate the error correction packets 358 generated at step 350 and accordingly, trailer group 404 can have a fewer or greater number of packets depending on the size of super group 304 and the desired error correction operation 354.

Figure 8:
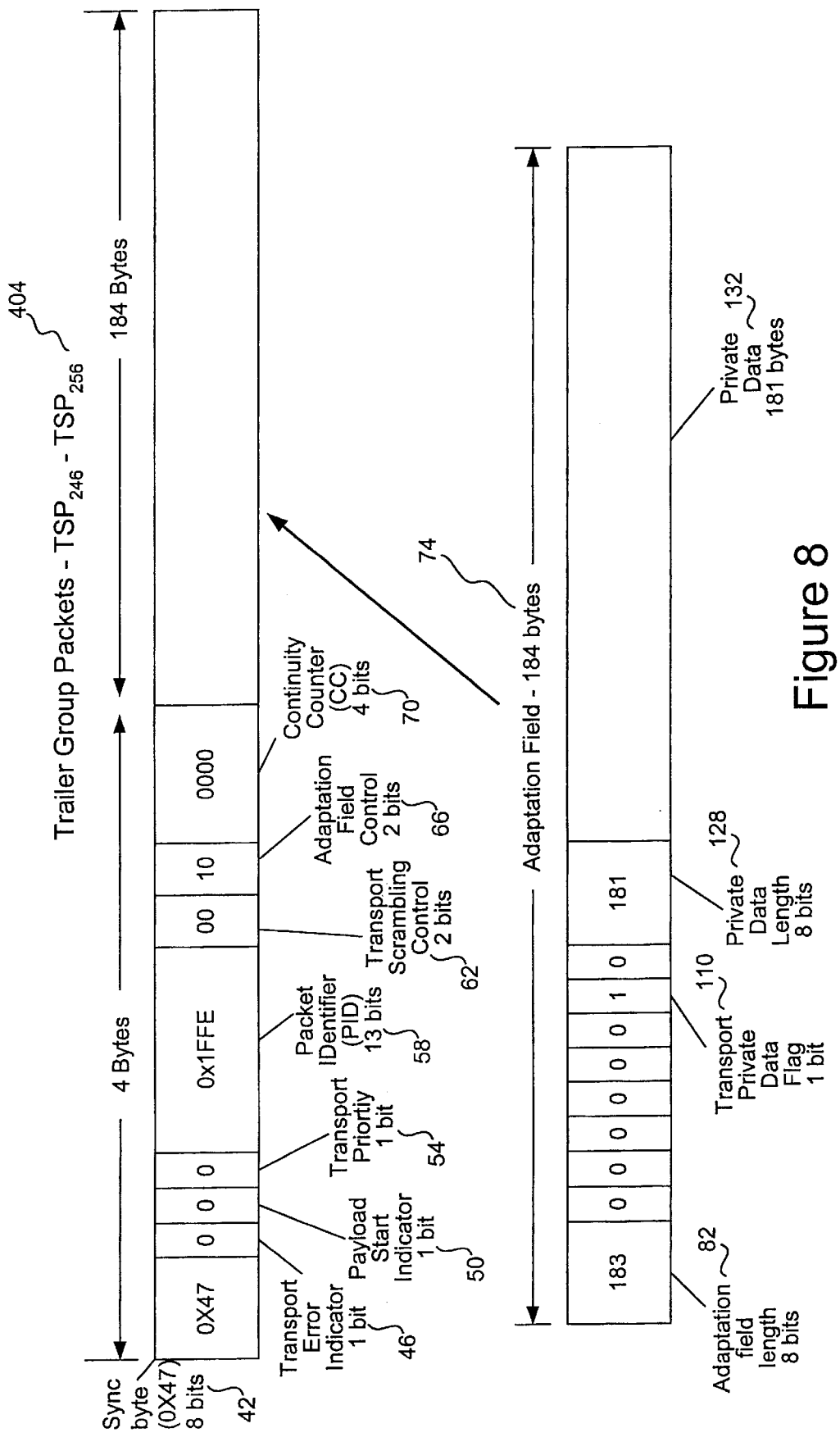
FIG. 8 shows a schematic representation of defining the trailer group of FIG. 7 to be optional and to have no payload data.
Figure 9:
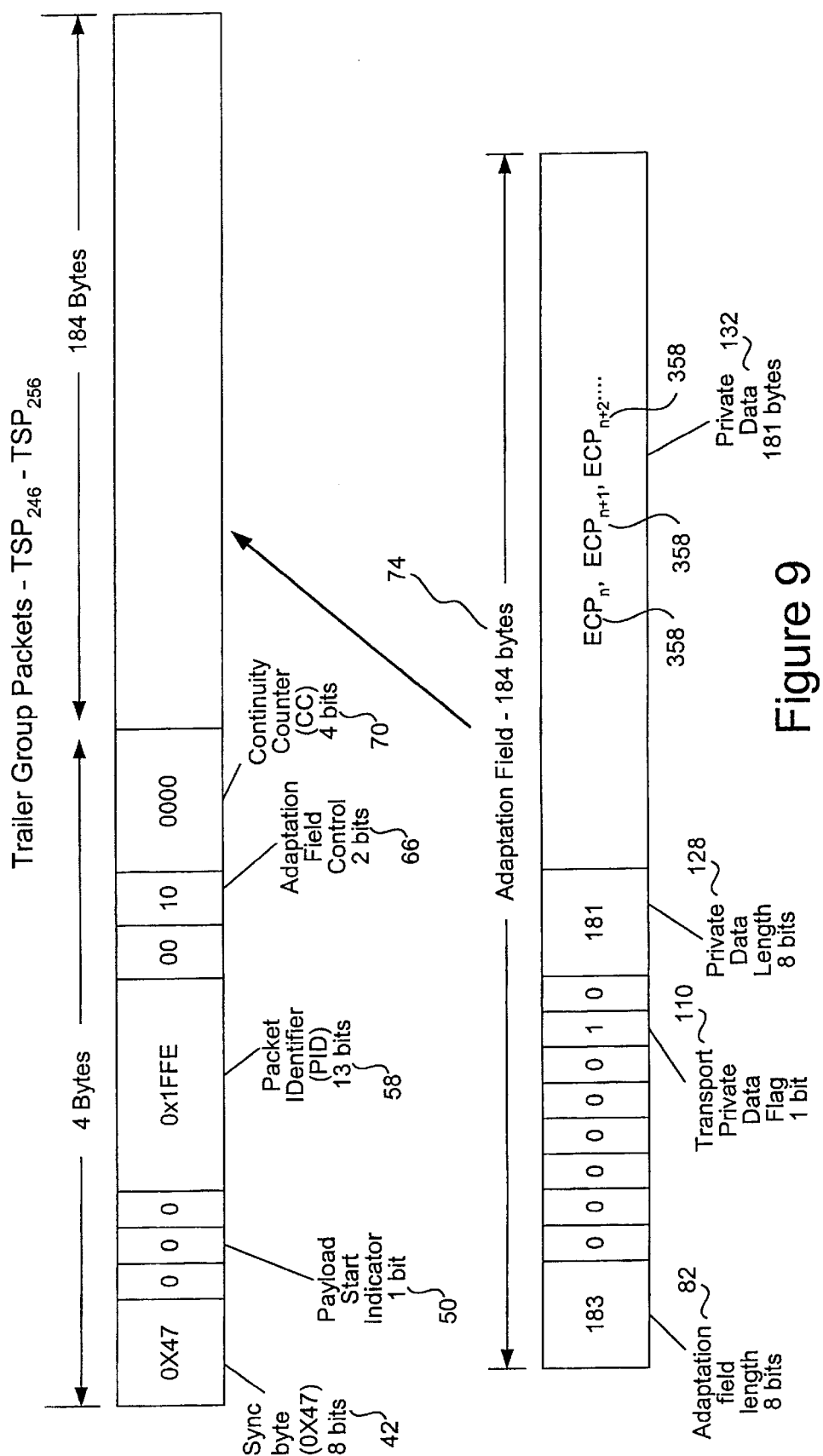
FIG. 9 shows a schematic representation of embedding the error correction information shown in FIG. 8 into the first nine transport stream packets of the trailer group shown in FIG. 7, and in accordance with the method of FIG. 4.

As shown in detail in FIG. 8, each packet within trailer group 404 (TSP$_{246}$, ... TSP$_{256}$) has an adaptation field 74 fixed at one-hundred-eighty-four bytes in length, and has no payload data 78. Each trailer group 404 packet is made optional by setting transport error indicator 46, payload start indicator 50 and transport priority 54 all to the value of zero. In accordance with the MPEG-2 standard, it is presently preferred that Packet Identifier 58 for each trailer group 404 packet be "0x1FFF" in order to avoid collision of Packet Identifiers 58 in trailer group 404 with other Packet Identifiers 58 in transport stream 208. For greater clarity, such a collision occurs when a trailer group 404 packet has a common Packet Identifier 58 with another packet in super group 304. The identifier is unique to trailer group 404 packets. It is presently preferred that a test be conducted to confirm that no collision will occur, and if a collision is likely to occur, Packet Identifiers 58 in trailer group 404 are changed to the next smaller value, which in the present example is "0x1FFD". If "0x1FFD" is likely to cause a collision, the "0x1FFC" is chosen, and so on. These values are registered with the Program Map Table in accordance with the MPEG-2 standard. Next, transport scrambling control 62 is set to "b00" and adaptation field control 66 is set to "b10" to indicate that the transport stream packet has adaptation field 74 only, and that no payload 78 follows adaptation field 74. By making these packets optional through setting their contents to be private, they will be transparent to MPEG-2 end-user 228 thus causing MPEG-2 end-user 228 to ignore trailer group 404. Having made the trailer group 404 packets optional, continuity counter 70 is set to a value of "b0000" for each transport stream packet in trailer group 404. Adaptation field length 82 is set to a value of one-hundred-and-eighty-three, transport private data flag 110 is set to a value of one, private data length 128 is set to a value of one-hundred-and-eighty-one in preparation for storage of error correction packets 358.

Figure 10:
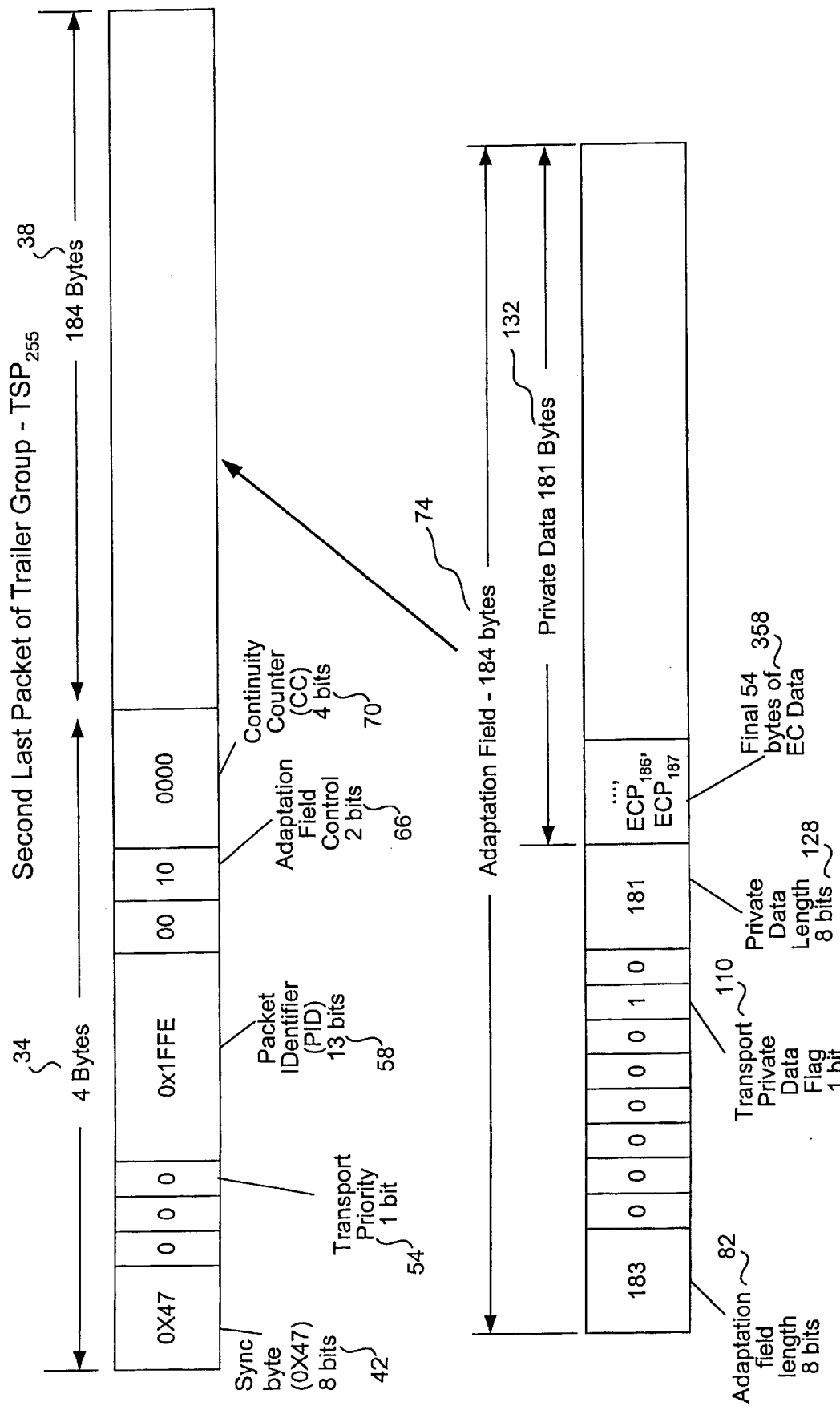
FIG. 10 shows a schematic representation of embedding error correction information into the second last packet of the trailer group shown in FIG. 7, and in accordance with the method of FIG. 4.

At step 450 of FIG. 4, error correction packets 358 are inserted into the private data fields 132 of trailer group 404 transport stream packets (TSP$_{246}$, TSP$_{247}$, ... TSP$_{255}$). The insertion of error correction packets 358 into TSP$_{246}$ through TSP$_{255}$ is shown in greater detail with reference to FIGS. 9 and 10. Because a whole number of nine-byte error correction packets 358 do not fit within each one-hundred-and-eighty-one-byte private data field 132 of each trailer group transport stream packet, it is necessary to split some error correction packets 358 between consecutive trailer group packets. For greater clarity, ECP$_1$ through ECP$_{20}$ and the first byte of ECP$_{21}$ are inserted into TSP$_{246}$. The remaining eight bytes of ECP$_{21}$, the entirety of ECP$_{22}$ through ECP$_{40}$ and the first two bytes of ECP$_{41}$ are inserted into TSP$_{247}$. This process continues until all one-hundred-and-eighty-one bytes of private data 132 in TSP$_{246}$ through TSP$_{254}$ are filled with error correction packets 358. FIG. 10 shows the insertion of the remaining error correction packets 358 into the first fifty-four bytes of private data 132 of TSP$_{255}$.

Figure 11:
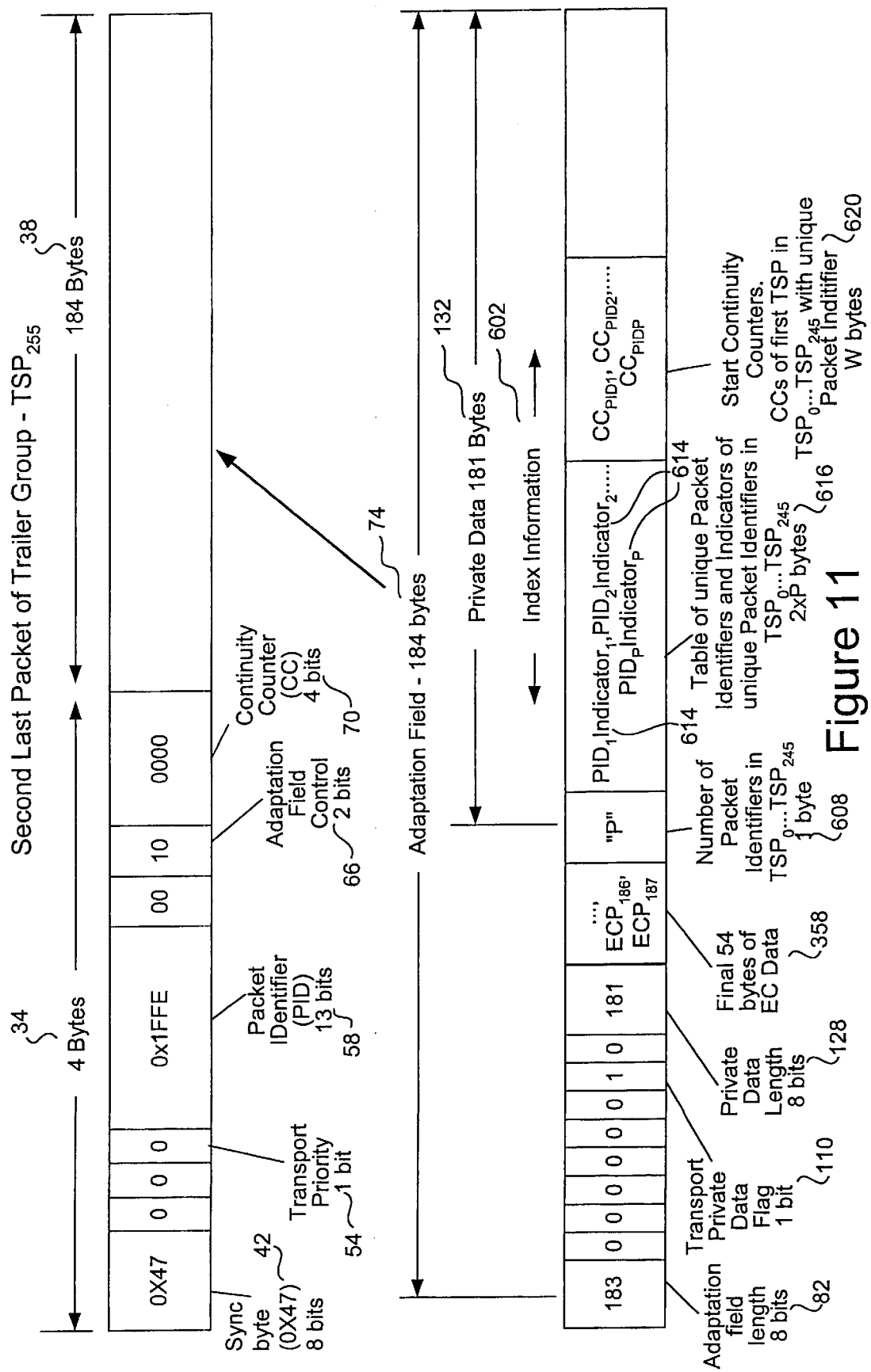
FIG. 11 shows a schematic representation of storing index information into the second last packet of the trailer group shown in FIG. 7, and in accordance with the method of FIG. 4.

Referring to FIG. 4, at step 500 identifiers or indices 612 are generated to identify the positions of each packet within super group 304. Step 500 is shown in greater detail with reference to FIGS. 11–11b. Referring first to FIG. 11, index information 602 comprises the number 608 of unique packet identifiers in super group 304, a table 616 of unique identifiers and indicators 614, and start continuity counters 620. First, each packet in super group 304 is scanned to determine the number "P" of unique Packet Identifiers 58 in super group 304. "P" is then stored in private data field 132 of TSP$_{255}$, as indicated at 608. Next, indicators 614 (Indicator$_1$—Indicator$_P$) are determined, each of which indicates the number of bits that will be required to represent a sequence index 612 for each unique Packet Identifier 58 found in super group 304. It is presently preferred that each indicator 614 is three bits in length and its value is set to four or "b100", thereby indicating that the sequence index 612 for each Packet Identifier 58 is four bits. Table 616 of indicators 614 and their corresponding Packet Identifier 58 (PID$_1$. . . PID$_P$) are stored in private data field 132 of TSP$_{255}$. For greater clarity PID$_1$ is the first unique Packet Identifier 58 in super group 304 and its corresponding index 612 will be "b0000"; PID$_2$ is the second unique Packet Identifier 58 in super group 304 (TSP$_0$, TSP$_1$, ... TSP$_{245}$) and its corresponding index 612 will be "b0001", etc. Because each Packet Identifier is thirteen bits, and each indicator 614 is three bits, the total space required for each pair 616 is sixteen bits or two bytes. Accordingly, in the presently preferred embodiment, a total of two-times-P (2×P) bytes are required to store all of table 616.

Next, each of the continuity counters 70 of the first transport stream packet within super group 304 having a unique Packet Identifier 58 are copied sequentially into TSP$_{255}$ to form start continuity counters 620. For greater clarity CC$_{PID1}$ is the first continuity counter 70 of the first transport stream packet having the first unique Packet Identifier 58 (PID$_1$) in super group 304; CC$_{PID2}$ is the first continuity counter 70 of the first transport stream packet having the second unique Packet Identifier 58 (PID$_2$) in super group 304, and so on. Start continuity counters 620 requires a total of W bytes, which is determined using Equation 1 in Appendix A.

Figure 11A:
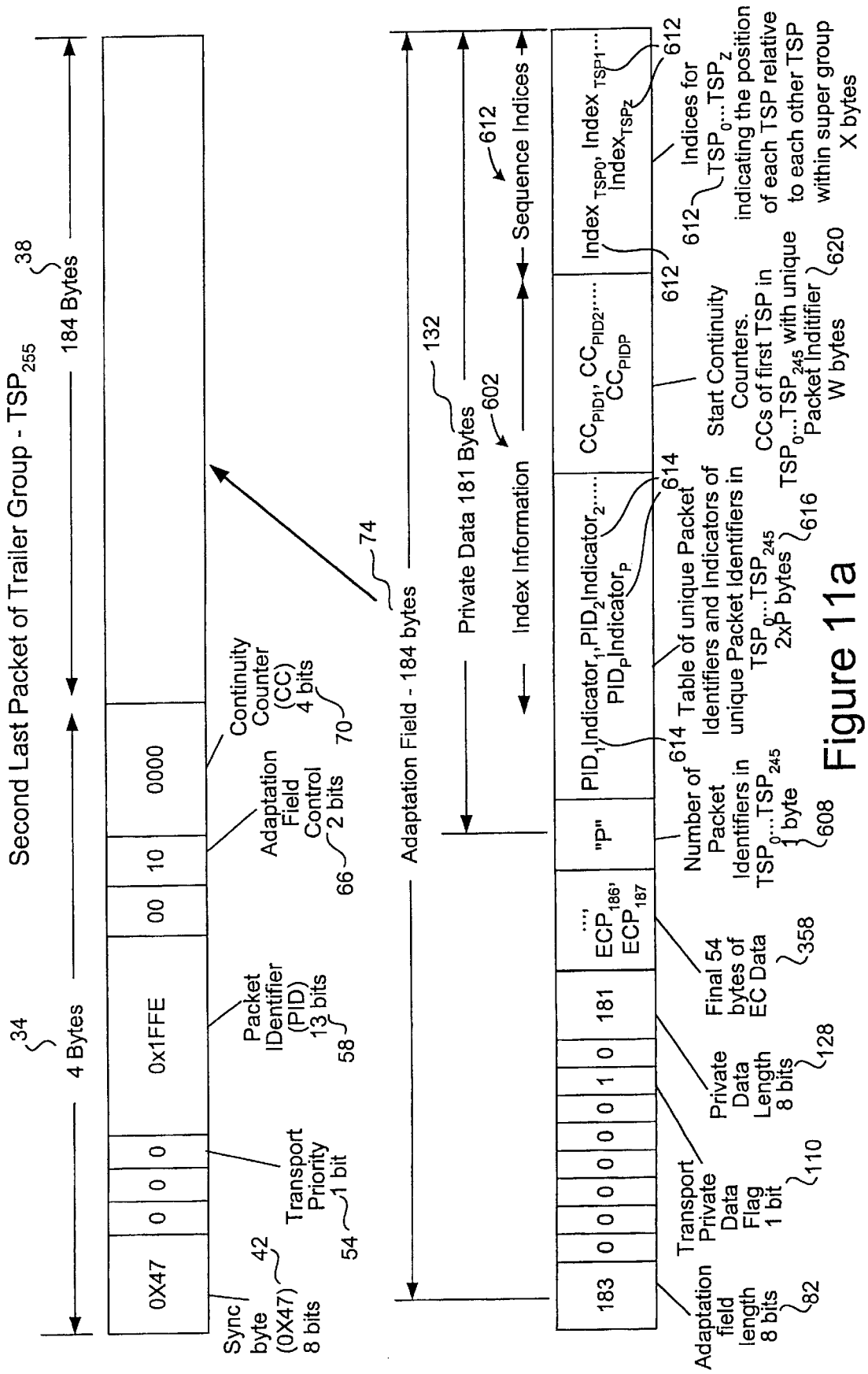
FIG. 11a shows a schematic representation of storing sequence indices into the second last packet of the trailer group shown in FIG. 7, and in accordance with the method of FIG. 4.

Referring now to FIG. 11a, sequence indices 612 corresponding to each packet identifier 58 in each sequential transport stream packet of super group 304 from TSP$_0$ through TSP$_Z$ are stored in TSP$_{255}$ until TSP$_{255}$ is full. Sequence indices 612 require a total of X bytes, which is determined using Equation 2 in Appendix A. Z, the number of transport stream packets whose sequence index is stored in TSP$_{255}$, is determined using Equation 3 in Appendix A. It will be apparent to persons of skill in the art that Z can equal a value of two-hundred-and-forty-five, for example, in the case where all of the transport stream packets in super group 304 have the same Packet Identifier 58, and accordingly all sequence indices 612 would be stored within TSP$_{255}$.

Figure 11B:
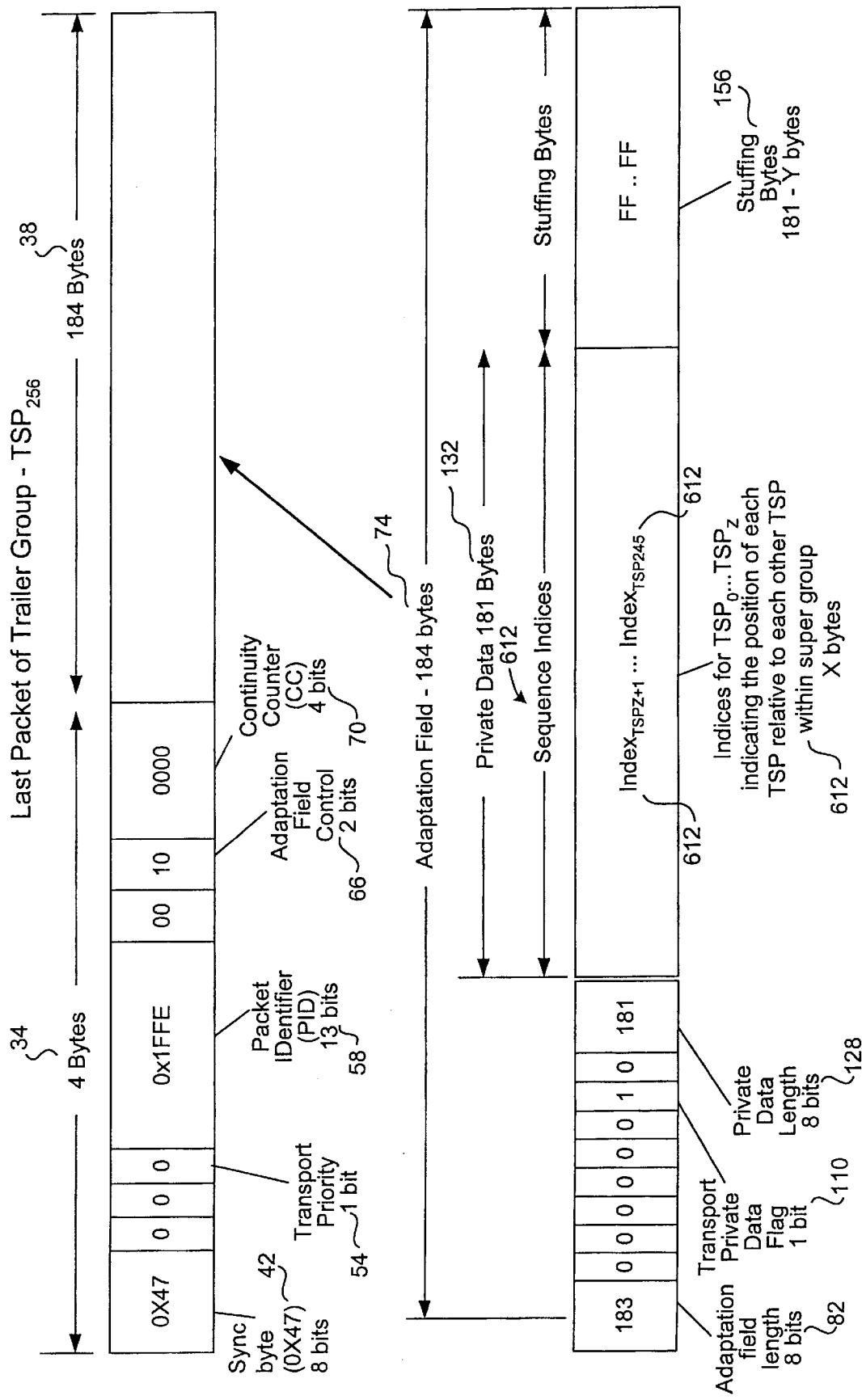
FIG. 11b shows a schematic representation of storing sequence indices into the last packet of the trailer group shown in FIG. 7, and in accordance with the method of FIG. 4.

Referring now to FIG. 11b, the remaining sequence indices 612, if any, are stored in TSP$_{256}$. As shown in FIG. 11b, sequence indices 612 require a total of Y bytes, which is determined using Equation 4 in Appendix A. Where Y is less than one-hundred-and-eighty-one bytes, stuffing bytes 156 will be added to the end of TSP$_{256}$ to fill the packet. It will be apparent to persons of skill in the art that where Z has a value of two-hundred-and-forty-five, Y will have a value of zero, and, that the formation of TSP$_{256}$ is optional.

It will be appreciated by persons skilled in the art that other methods of identifying the location of packets within super group 304 can be performed, such as embedding a unique identifier or absolute sequence number in the private data fields 132 of each of the transport stream packets within super group 304. However, this method can have disadvantages in that it necessitates the creation of new transport stream packets that accommodate the displaced payload data during the process of embedding absolute sequence numbers, although the result is that the error correction information is still optional and therefore transparent to an asymmetric decoder. Another method of identifying the location of packets employs a combination of: embedding absolute sequence numbers in the first packet of sub-groups or intervals of transport stream packets within the super group, and storing sequence identifiers in the trailer group of the remaining packets in each sub-group, relative to the absolute sequence numbers. In this method, it is presently preferred to provide two-hundred-and-forty-six packets in each super group and six packets in each sub-group, and performing a Reed-Solomon operation which, when combined with the generated sequence identifiers, generates a total often packets in the trailer group. This method suffers the same disadvantage as storing absolute sequence numbers in each transport stream packet, as it necessitates the creation of new transport stream packets to accommodate displaced payload data. Other methods of identifying the location of packets within super group 304 will occur to persons of skill in the art, and are within the scope of the present invention.

It will be understood by persons of skill in the art that the inherent features of $TSP_{256}$ can be used to signify the end of super group 304. For example, simply using packet identifier 58 to identify that $TSP_{246}$ through $TSP_{256}$ are trailer group 404 transport stream packets. However, an "end trailer group" identifier, such as "0×1F1F1FFE", can be added to the end of the last packet ($TSP_{256}$) of trailer group 404 to indicate the end of trailer group 404 to a symmetric decoder 262. However, the inclusion of an "end trailer group" identifier is not a critical feature of the present invention.

Steps 300 to 500 are then repeated for subsequent super groups 304 of two-hundred-and-forty-six transport stream packets, thereby generating a continuous enhanced transport stream 258. It is presently preferred to generate and send a pair of super groups 304 and then a pair of corresponding trailer groups 404 as shown in FIG. 12 in order to protect for some types of bursty errors, however, this can be eliminated by inserting extra, optional null transport stream packets 412 between super group 304 and the trailer group 404, each containing only stuffing bytes 156, as shown in FIG. 12a. It is presently preferred that the number of null packets 412 be equivalent to the maximum number of transport packets lost due to a bursty error.

It will now be apparent that enhanced transport stream 258 has optional forward error correction information included therein, such that super group 304 can be simply transmitted directly to MPEG-2 end-user 228. Accordingly, super group 304 ($TSP_0 \ldots TSP_{245}$) can be processed by MPEG-2 end-user 228, and trailer group 354 ($TSP_{246} \ldots TSP_{256}$) will be transparent to MPEG-2 end-user 228. Alternately, super group 304 can be transmitted to a symmetric decoder 262 which can decode $TSP_0$ through $TSP_{245}$ and utilize the error correction data contained within trailer group 404 ($TSP_{246} \ldots TSP_{256}$) to reassemble lost packets. As will be apparent, one of the advantages of the present invention is that a broadcaster of an enhanced transport stream 258 does not need to know if the receiver has a suitable decoder.

It will be apparent from the foregoing that super group 304 can have a fewer or a greater number of transport stream packets than the presently preferred embodiment. There are three main factors that can affect the selection of the size of the super group 304. First, a super group 304 of two-hundred-and-forty-six transport stream packets allows the recovery of up to nine lost transport stream packets or up to four-and-a-half errored transport stream packets. This meets the requirements of an environment requiring a bit error ratio of $10^{-3}$ to $10^{-2}$ which is acceptable for both cable and satellite transmissions. A shorter super group 304 with the same length of trailer group 404 would be able to work in an environment having a higher bit error ratio, while a longer super group in an environment of a lower bit error ratio. Second, a super group 304 having two-hundred-and-forty-six transport stream packets has a low overhead of 4.47%. However, a super group 304 with fewer transport stream packets would have a higher percentage of overhead. Finally, a super group with more transport stream packets would result in increased computational complexity for the error correction operation.

Figure 13:
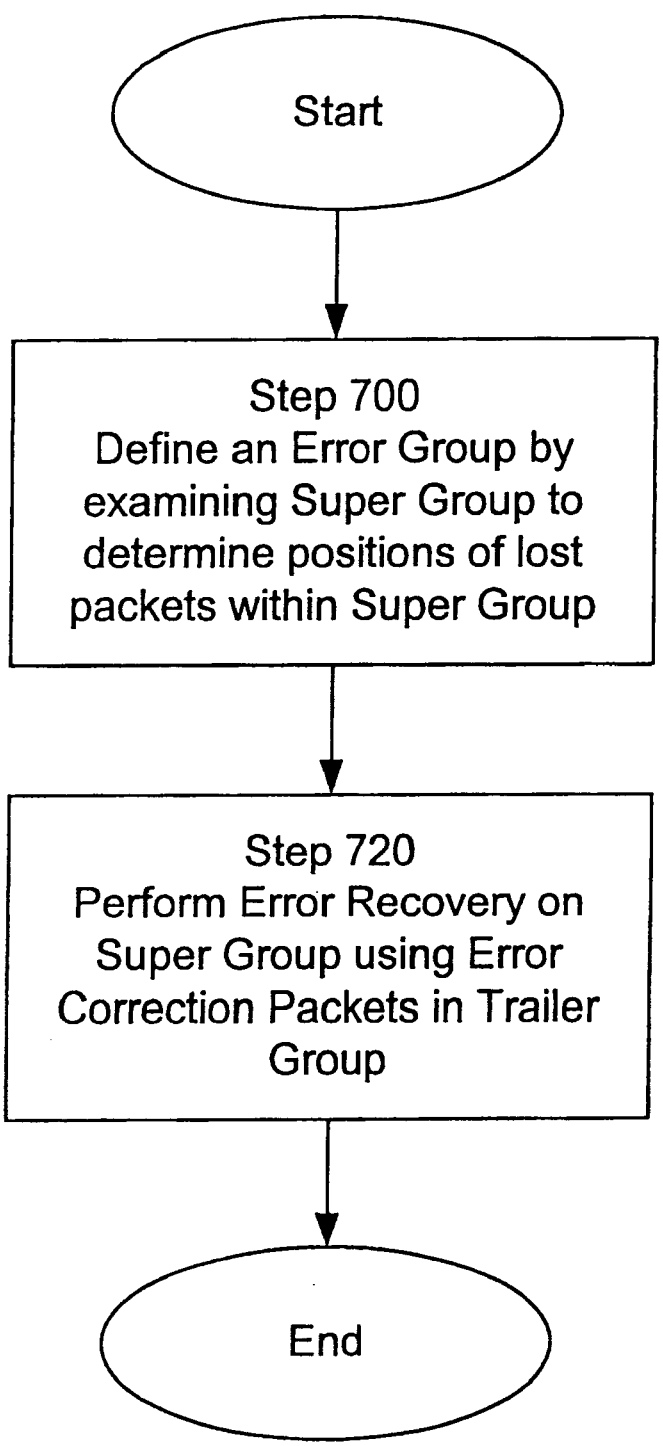

Having described an encoding method in accordance with the preferred embodiment of the present invention, a decoding method symmetric to the encoding method of FIG. 4, and in accordance with another embodiment of the present invention will now be described with reference to FIG. 13. At Step 700 decoder 262 takes a super group 304 from enhanced transport stream 258, and defines an error group by examining super group 304 to determine the consecutive positions of any lost transport stream packets within super group 304. In the event that more than one consecutive group is located, an error group is defined for each and processed in turn. Table 616, start continuity counters 620 and indices 612 are first accessed from the trailer group 404 received from enhanced transport stream 258. Using these data, Packet Identifiers 58 and continuity counters 70 for each transport stream packet 30 in super group 304 are reconstructed and are sorted into their original order. Next, Packet Identifiers 58 and continuity counters 70 from super group 304 received from enhanced transport stream 258 are compared to the reconstructed values to reveal the positions of lost transport stream packets in super group 304. It will be apparent that, where no transport stream packets are lost, a one-to-one correspondence will be found during the comparison and the process can move directly to step 720. However, if the Packet Identifiers 58 and continuity counters 70 do not match with their corresponding index 612, but instead match the values of some later index 612 in the stored sequence, then the error group is defined as comprising the range of lost consecutive transport stream packets between the first mismatch and the location of where the next match is found. Other error groups can be found within super group 304 by repeating this process.

At step 720, an error recovery operation is performed to recover all lost transport stream packets within the error group. The error recovery operation is symmetric to error correction operation 354, and in the presently preferred embodiment Reed Solomon decoding is used. The error recovery operation is performed by using corresponding error correction packets 358 embedded within trailer group 404. The individual bit errors within transport stream packet are recovered simultaneously. As the exact positions of bit errors are not directly detectable, such errors are processed by the inherent features of the Reed Solomon bit error decoding operation. Once super group 304 is completely corrected, decoder 262 then outputs super group 304 as a portion of transport stream 208. Steps 700 and 720 are then repeated for subsequent super groups, thereby continuously error correcting enhanced transport stream 258 and outputting transport stream 208.

In another embodiment of the present invention, error correcting data can be generated and inserted into a private data field 132 of each transport stream packet. Since private data field 132 is optional, an asymmetric decoder will still ignore the data contained within the private data field, but will process the payload data according to the MPEG-2 standard. In this embodiment, part of the payload of each transport stream packet is shifted into new transport stream packets, and then error correction data is embedded within the remaining space of the private data field of each transport stream packet. In other words, each transport stream packet carries some payload and some error correction data. This embodiment is presently less preferred as it requires interleaving of error correction information with the payload in each of the transport stream packets to deal with "bursty" errors and it also requires the generation of additional overhead to accommodate the adaptation field in each transport stream packet.

In another embodiment of the present invention, error correction data can be embedded within other private data packets, private sections or descriptors etc. as defined within the MPEG-2 standard. For example, the error correction data can be inserted into payload 78 by defining a private packet identifier 58 in the Program Map Table assigning it a value between "0x80" and "0xFF", as more particularly defined in the MPEG-2 standard.

It will be apparent that the present invention can be implemented by hardware or software, and that it need not be implemented using an independent encoder 254 and decoder 262. Instead, encoder 254 can be integral with an MPEG-2 encoder, and decoder 262 can be integral with the MPEG-2 decoder.

While only specific combinations of the various features and components of the present invention have been discussed herein, it will be apparent to those of skill in the art that desired sub-sets of the disclosed features and components and/or alternative combinations of these features and components can be utilized, as desired. For example, while the embodiments discussed herein are directed to error correcting data streams such as the transport stream according to the MPEG-2 standard, it is to be understood that the present invention is applicable to other data streams such as the MPEG-1 standard, future MPEG standards or other time ordered data streams.

The present invention provides a novel system and method for a novel forward error correction method and system to protect a digital transport stream, by providing an MPEG-2 compliant enhanced transport stream with optional forward error correction data included therein. Accordingly, the present invention can be used as a means of forward error correcting an MPEG-2 transport stream for broadcast in any of the Digital Video Broadcast formats without the need for effectively creating another protocol layer in order to add error correction. This results in an error correction system and method that does not require decoders symmetric to the error correction encoders, and yet provides the flexibility of providing an error correcting decoder to improve the reliability of an MPEG-2 transport stream.

It is believed that the present invention results in a system and method for forward error correction with less delay than current systems and methods known in the art, as the transport stream packets need not be interleaved. It is further believed that strong error recovery is available as up to nine lost transport stream packets and up to four-and-a-half errored packets can be corrected in a presently preferred embodiment. It is also believed that the present invention results in a forward error correcting system and method with low overhead, as only 4.47% of data is added, while still achieving powerful error recovery ability.

APPENDIX A $$W = \text{int}(P/2 + 0.5) \qquad \text{Equation 1}$$

$$X = \min(246 \times \tfrac{4}{8}, 126 - 2 \times P - W) = \min(123, 126 - 2 \times P - W) \qquad \text{Equation 2}$$

$$Z = 2 \times X - 1 \qquad \text{Equation 3}$$

$$Y = \max(0, 246 \times \tfrac{4}{8} - (126 - 2 \times P - W)) = \max(0, 2 \times P + W - 3) \qquad \text{Equation 4}$$

What is claimed is:

1. A system for providing compressed video data, the system comprising:
    a processor designed or configured to receive compressed video contained in data packets, and designed or configured to output a data stream comprising a super group including a predefined number of packets and a trailer group including a sufficient number of packets to accommodate error correction data obtained from forward correction of the compressed video data; and
    a transmitter designed or configured to transmit the super group and the trailer group, wherein the trailer group includes information identifying each trailer group packet as optional.

2. The system of claim 1 wherein the compressed video data is compressed according to an MPEG standard.

3. The system of claim 1 wherein the trailer group includes index data which relates the error correction data to one or more corresponding super group packets.

4. The system of claim 1 wherein information identifying each trailer group packet as optional is provided to direct asymmetric decoders to ignore the error correction data in the trailer group.

5. The system of claim 1 wherein processor is designed or configured to output the trailer group after the super group.

6. The system of claim 5 wherein the processor is designed or configured to output two super groups followed by two corresponding trailer groups.

7. The system of claim 5 wherein the processor is designed or configured to output the super group followed by a predefined number of null packets before the trailer group.

8. The system of claim 7 wherein the predefined number of null packets is equivalent to an estimated maximum burst error of a broadcast environment.

9. The system of claim 1 wherein the processor is further designed or configured to perform Reed Solomon coding to provide the error correction data.

10. The system of claim 1 wherein the processor is further designed or configured to perform error correction operation on parallel bytes within each packet of the super group.

11. The system of claim 1 the processor is further designed or configured to shift compressed data from the super group to the trailer group.

12. A system for providing compressed video data, the system comprising:
    means for processing compressed video data contained in compressed video data packets to output a data stream comprising a super group including a predefined number of data packets and a trailer group including a sufficient number of packets to accommodate error correction data obtained from forward correction of the compressed video data; and
    means for transmitting the super group and the trailer group.

13. The system of claim 12 wherein the means for processing compressed video data performs an error correction operation on parallel bytes of each packet within the super group.

14. A system for receiving compressed video data, the system comprising:
    a receiver designed or configured to receive a data stream comprising a super group and a trailer group, the super group comprising compressed video data, the trailer group comprising error correction data, indexing information, and a tag identifying each trailer group packet as optional; and a processor designed or configured to perform an error recovery operation on the compressed video data in the super group using the error correction data and the indexing information contained in the trailer group.

15. The system of claim 14 further comprising a decoder designed or configured to decompress the compressed video data.

16. The system of claim 15 wherein the decoder is designed or configured to decompress the compressed video data without using the comprising error correction data and indexing information.

17. The system of claim 14 wherein the processor is further designed or configured to extract the super group and the trailer group from a data stream received by the receiver.

18. The system of claim 14 the compressed video data is compressed according to an MPEG standard.

19. The system of claim 14 wherein the processor is designed or configured to perform Reed Solomon coding to provide the error recovery.

20. A system for receiving compressed video data, the system comprising:

receiving means for receiving a data stream;

processing means for extracting a super group and a trailer group corresponding to the super group from the received data stream; and processing means for performing an error recovery operation on compressed video data in the super group using the error correction data in the corresponding trailer group, wherein the trailer group includes a tag identifying each trailer group packet as optional.

21. The system of claim 20 further comprising decoder means for decompressing the compressed video data.

22. The system of claim 21 wherein the decoder means decompresses the compressed video data without using the comprising error correction data and indexing information.

* * * * *